United States Patent [19]

Shoda

[11] Patent Number: 5,747,863

[45] Date of Patent: May 5, 1998

[54] INFRARED SOLID-STATE IMAGE PICKUP DEVICE AND INFRARED SOLID-STATE IMAGE PICKUP APPARATUS EQUIPPED WITH THIS DEVICE

[75] Inventor: Masahiro Shoda, Gyoda, Japan

[73] Assignee: Nikon Corporation, Tokyo, Japan

[21] Appl. No.: 676,804

[22] Filed: Jul. 8, 1996

[51] Int. Cl.$^6$ ........................ H01L 31/00; H01L 31/0232
[52] U.S. Cl. ........................ 257/440; 257/278; 257/294; 257/432; 257/443; 250/370.14; 250/339.02; 250/332
[58] Field of Search ........................ 257/228, 451, 257/449, 455, 443, 448, 432, 437, 294, 440; 250/332, 370.14, 370.08, 338.4, 339.02

[56] References Cited

U.S. PATENT DOCUMENTS 4,956,555  9/1990  Woodberry ........................ 250/339.02

FOREIGN PATENT DOCUMENTS 0281058  7/1990  Germany ........................ 257/440
1187858  7/1989  Japan ........................ 257/451
2206793  8/1990  Japan ........................ 257/440

OTHER PUBLICATIONS

Tanabe et al, SPIE, vol. 2020 "Infrared Tech" XIX 1993 pp. 22–29 Utilizing a Optical Cavity . . . Sensor.

Elabd, RCA Review, vol. 43 Dec. 1982, pp. 569–589 "Theory and Measurements . . . Optical Cavity".

"Infrared Detectors and Focal Plane Arrays III", SPIE—The International Society for Optical Engineering, Eustace L. Dereniak et al., 5–6 Apr. 1994., Orlando, Florida., vol. 2225 pp. 44–59 (A1).

"Infrared Detectors and Focal Plane Arrays III", SPIE—The International Society for Optical Engineering, Eustace L. Dereniak et al., 5–6 Apr. 1994., Orlando, Florida., vol. 2225 pp. 26–43 (A2).

"Smart Focal Plane Arrays and Focal Plane Array Testing", SPIE—The International Society for Optical Engineering., Marc Wigdor et al., 17–18 Apr. 1995., Orlando, Florida., vol. 2474 pp. 111–116 (A3).

"The Photoresponse of Thin–Film PtSi Schottky Barrier Detector with Optical Cavity", RCA Review., Hammam Elabd et al., Sep. 1982., Princeton, New Jersey., vol. 43 pp. 542–547 (A4).

Primary Examiner—Jerome Jackson
Attorney, Agent, or Firm—Foley & Lardner

[57] ABSTRACT

The infrared solid-state image pickup device of the present invention comprises a light-receiving portion formed by arranging, on a transparent substrate, light-receiving elements of a plurality of types respectively including optical cavity structures with optical distances between photoelectric conversion portions and reflecting films which are different from each other by more than 100 nm. The light-receiving elements of at least one of the plurality of types having optical cavity structures whose optical distances are set such that a valley in sensitivity exists at a predetermined wavelength within a predetermined wavelength range, light within the wavelength range being photoelectrically convertible by the light-receiving elements of other types. Hence, the light-receiving portion can be divided into wavelength bands, and a structure enabling control of a wavelength sensitivity, can have, in an infrared range, a function corresponding to a complementary color detection function in a so-called visible range.

13 Claims, 15 Drawing Sheets

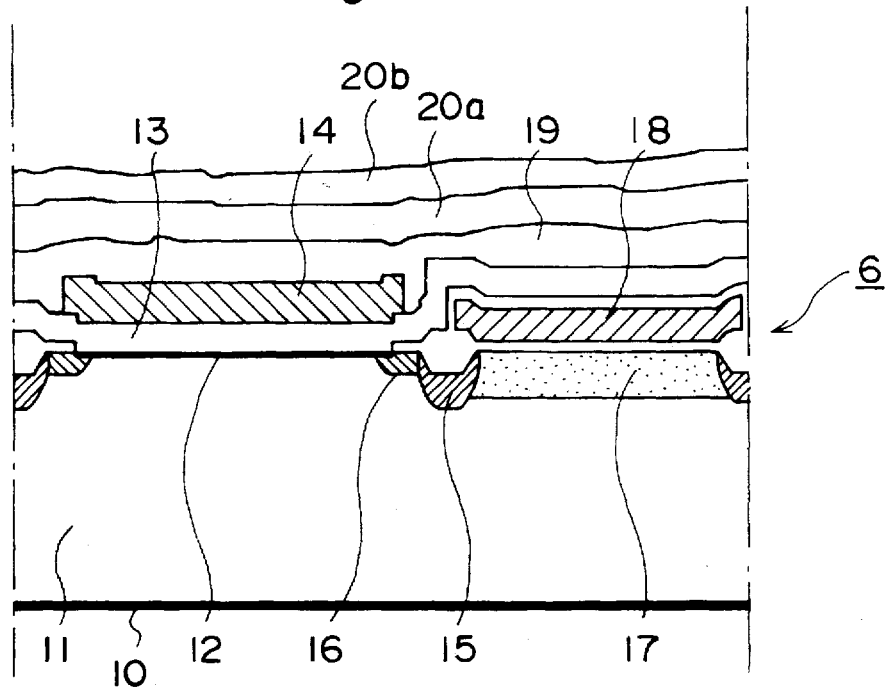
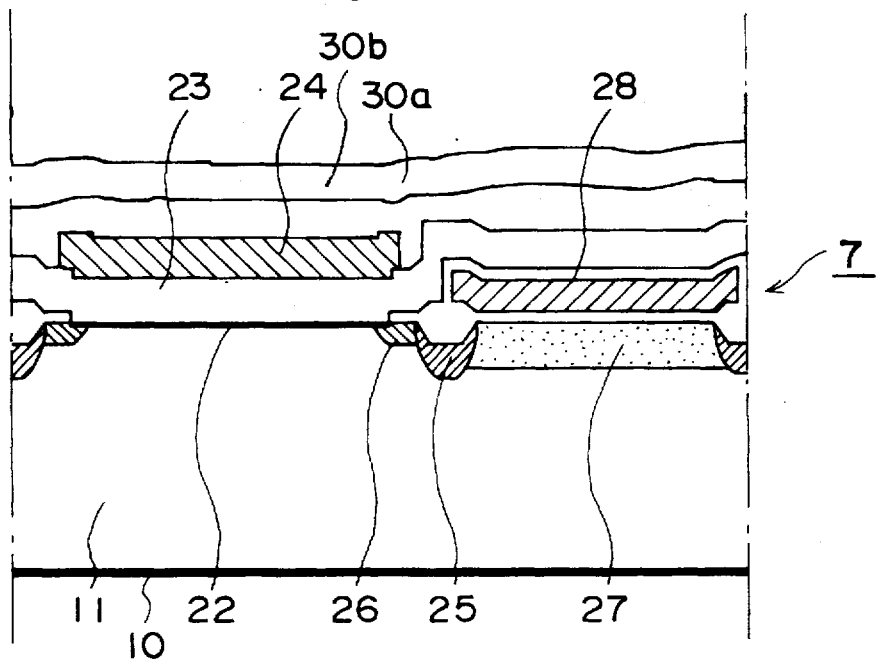

INFRARED SOLID-STATE IMAGE PICKUP DEVICE AND INFRARED SOLID-STATE IMAGE PICKUP APPARATUS EQUIPPED WITH THIS DEVICE

BACKGROUND OF THE INVENTION

1. Field of the Invention

The present invention relates to an infrared solid-state image pickup device performing an image pickup operation in an infrared range as a solid-state pickup device, and to a infrared solid-state image pickup apparatus equipped with the infrared solid-state image pickup device. More particularly, the present invention relates to infrared solid-state image pickup device which measures the temperature of an object to be detected and identifies the composition of a sample, on the basis of the wavelength spectrum of radiated energy.

2. Related Background Art

In general, an object having a temperature emits some infrared rays. For this reason, an infrared image pickup apparatus using an infrared solid-state image pickup device can capture an image even on a dark night, when no image can be captured in a visible light range. An infrared image pickup apparatus is used for the purpose of monitoring or the like. For monitoring, detection of an infrared ray emitted from an object suffices. Therefore, a conventional infrared image pickup apparatus is sufficiently practical as long as its sensitivity with respect to an infrared ray is high.

An object emits an infrared ray corresponding to its temperature. For this reason, when an infrared dose picked up and received by the infrared image pickup apparatus is measured, the temperature of the object can be detected. On the basis of this finding, infrared thermometers using infrared image pickup devices for temperature measurement have been developed.

There is a concept of a black body as an ideal thermal radiation body. The thermal radiation amount of an actual object is smaller than that of a black body at the same temperature, and the ratio therebetween is generally called an emissivity. Therefore, when the emissivities of individual objects are known, the true temperature can be calculated by measuring the infrared irradiation amount, i.e., the thermal radiation amount from an object by using the infrared image pickup apparatus. The conventional infrared thermometer can designate the emissivities of objects.

As for thermal radiation from an object, the Planck's law of distribution is known: when the temperature of an object changes, the wavelength distribution of an energy radiated from the object changes. A black body having an emissivity of 1 has a spectral radiant intensity which changes in accordance with the temperature. According to the Planck's law of distribution, as the temperature of an object increases, energy radiation with shorter-wavelength components increases. In addition, Stefan-Boltzmann's law is established: when an energy radiated from an object at a certain temperature is integrated in the direction of wavelength, the energy is proportional to the fourth power of the absolute temperature of the object.

The conventional infrared thermometer measures an energy radiated from an object and calculates the temperature of the object from the magnitude of the energy on the basis of the Stefan-Boltzmann's law.

In the field of analysis science, apparatuses have been developed which measure the emission or absorption spectrum of a sample in an infrared wavelength range and identify the composition of a sample on the basis of the characteristic spectrum of the substance.

In a conventional infrared image pickup apparatus used as an infrared thermometer as described above, the infrared detection sensitivity is increased by employing a structure generally called an optical cavity structure. In this case, all light-receiving elements on the light-receiving portion have an optical cavity structure of the same designed shape. That is, all the light-receiving elements have the same optical distance between photoelectric conversion portions and reflecting films.

A construction schedule control that sets the optical distance of the optical cavity structure constant is depend on the performance of a manufacturing system and the condition of manufacture. For this reason, the optical distance of the optical cavity structure generally has the error within about ±50 nm from a designated value.

However, when the above-described infrared image pickup apparatus is to be used to measure a temperature by measuring an infrared radiation amount from an object, the temperature of the object cannot be properly measured in many cases. This is because the emissivities of all substances are not provided as a table. When the emissivity is unknown, the user must experimentally calculate the emissivity in advance, and a long time is required for this process. In fact, the user often assumes that the emissivity is equal to that of a black body by agreement that the emissivity does not correspond to the true temperature of the object. In such a situation, meaningful temperature measurement cannot be performed.

The emissivity of an object is constant independently of the wavelength or depends on the wavelength. Even with a dependency on the wavelength, the emissivity can often be regarded as a constant value within a narrow wavelength range. Therefore, as far as the emissivities of individual objects are constant within the image pickup wavelength range, though the emissivities of individual objects are different, an energy radiation amount from an object can be measured at a plurality of wavelengths, and the temperature of the object can be detected from the wavelength distribution of the energy, on the basis of the Planck's law of distribution.

When this idea can be realized by an infrared thermometer using an infrared image pickup device, an excellent temperature measuring apparatus capable of measuring a two-dimensional temperature distribution in a non-contact state at a high speed can be obtained. When an infrared thermometer using an infrared solid-state image pickup device for detecting the temperature of an object on the basis of the wavelength distribution of an energy is to be realized, an image must be picked up by dividing a light-receiving portion into some wavelength bands. For this purpose, an infrared range filter corresponding to color filters of primary colors (red, green, and blue) for so-called visible light is essential.

For a solid-state image pickup device for visible light, a color filter can be easily formed using an organic material and a dye. In addition, the color filter can be easily applied to a solid-state image pickup device only by arranging the color filter in the photoelectric conversion portion. However, for an infrared range, a color filter using an organic material can hardly be realized unless a special inorganic material is deposited to form several layers. It is still more difficult to arrange filters of a plurality of types on the light-receiving regions of the respective light-receiving elements which are normally as small as about 20 µm². Particularly, for an image pickup device of a back-side ilumination type, the photoelectric conversion portion and the silicon wafer must be separated from each other, so the filter as described above cannot be arranged. Therefore, an infrared solid-state image pickup device for detecting the temperature of an object on the basis of the wavelength distribution of an energy cannot be realized.

Similarly, when the characteristic spectrum of a substance is to be extracted from an absorption or emission spectrum in the infrared range to two-dimensionally identify the composition of a sample, filters of several types must be arranged on the light-receiving elements of the infrared solid-state image pickup device. In addition, when spectrum measurement is to be performed in the infrared range, a spectroscope or a grating must be used, resulting in a large-scale device. Therefore, with an area sensor having light-receiving elements arranged in a matrix, identification of a sample on the basis of spectrum analysis in the infrared range cannot be realized.

SUMMARY OF THE INVENTION

The present invention has as its object to provide an infrared solid-state image pickup device and apparatus which can divide a light-receiving portion constituted by arranging a plurality of light-receiving elements in a matrix into some wavelength bands, as a structure enabling control of a wavelength sensitivity, and has, in an infrared range, a function corresponding to a complementary color detection function in a so-called visible range.

It is another object of the present invention to provide an infrared solid-state image pickup device and apparatus which can detect an absorption or emission spectrum with a specific wavelength at a high sensitivity on the basis of the complementary color detection function for the infrared range by using a plurality of light-receiving elements with different wavelength sensitivities.

It is still another object of the present invention to provide an infrared image pickup device and apparatus serving as an excellent thermometer which can measure a two-dimensional temperature distribution in a non-contact state at a high speed independently of an emissivity by using a plurality of light-receiving elements with different wavelength sensitivities.

In order to attain the above objective, the infrared solid-state image pickup device of the present invention comprises a light-receiving portion formed by arranging, on a transparent substrate, light-receiving elements of a plurality of types respectively including optical cavity structures with optical distances between photoelectric conversion portions and reflecting films which are different from each other by more than 100 nm; wherein the light-receiving elements of at least one of the plurality of types have the optical cavity structures whose optical distances are set such that first light incident on the photoelectric conversion portion and second light transmitted through the photoelectric conversion portion and reflected by the reflecting film which have a predetermined specific wavelength within a wavelength range mutually weaken their intensities, the wavelength range being photoelectrically convertible by the light-receiving elements of other types.

Here, preferably, in the infrared solid-state image pickup device of the present invention, the light-receiving portion is constituted by the light-receiving elements of a first type and a second type including the optical cavity structures whose optical distances are different from each other by more than 100 nm.

Also, preferably, in the infrared solid-state image pickup device of the present invention, the light-receiving portion is constituted by the light-receiving elements of a first type, a second type and a third type including the optical cavity structures whose optical distances are different from each other by more than 100 nm.

Also, preferably, in the infrared solid-state image pickup device of the present invention, the light-receiving portion is constituted by the light-receiving elements of a first type, a second type, a third type and fourth type including the optical cavity structures whose optical distances are different from each other by more than 100 nm.

Also, preferably, in the infrared solid-state image pickup device of the present invention, the light-receiving elements of at least one of the plurality of types include the optical cavity structures whose optical distances n·d are set such that the first light and the second light have the predetermined specific wavelength $\lambda$ satisfying a equation expressed as $\lambda=4 \cdot n \cdot d/N$, using N as even number.

Further, preferably, in the infrared solid-state image pickup device of the present invention, the optical cavity structures of the plurality of light-receiving elements consist of the photoelectric conversion portion formed on a first major surface of the substrate, a transparent insulating layer formed on the photoelectric conversion portion and the reflecting film formed on a transparent insulating layer, and wherein the photoelectric conversion portions convert the first light which is incident from a second major surface opposing the first major surface of the substrate and transmitted through the substrate and, of the first light, the second light transmitted through the photoelectric conversion portion and the insulating layer and reflected by the reflecting film into electrical signals.

In this case, desirably, a difference in optical distance between the light-receiving elements of different types is determined by a difference in thickness of the insulating layer. Also, desirably, a difference in optical distance between the light-receiving elements of different types is determined by a difference in refractive index of the insulating layer.

Next, in order to attain the above objective, the infrared solid-state image pickup apparatus of the present invention comprises (i) an infrared solid-state image pickup device which comprises a light-receiving portion formed by arranging light-receiving elements of a plurality of types on a transparent substrate; (2) an optical system guiding light from an object to the light-receiving portion; and (3) an arithmetic circuit reading a signal generated from the light-receiving portion; wherein the light-receiving elements of a plurality of types respectively include optical cavity structures with optical distances between photoelectric conversion portions and reflecting films which are different from each other by more than 100 nm, and wherein the light-receiving elements of at least one of the plurality of types have the optical cavity structures whose optical distances are set such that first light incident on the photoelectric conversion portion and second light transmitted through the photoelectric conversion portion and reflected by the reflecting film which have a predetermined specific wavelength within a wavelength range mutually weaken their intensities, the wavelength range being photoelectrically convertible by the light-receiving elements of other types.

Here, preferably, in the infrared solid-state image pickup apparatus of the present invention, the light-receiving portion is constituted by the light-receiving elements of a first type and a second type including the optical cavity structures whose optical distances are different from each other by more than 100 nm, and wherein the arithmetic circuit includes deviation detection means for detecting a difference between an electrical signal output from the light-receiving elements of the first type and that from the light-receiving elements of the second type.

Also, preferably, in the infrared solid-state image pickup apparatus of the present invention, the light-receiving portion is constituted by the light-receiving elements of a first type, a second type and a third type including the optical cavity structures whose optical distances are different from each other by more than 100 nm, and wherein the arithmetic circuit includes first deviation detection means for detecting a difference between an electrical signal output from the light-receiving elements of the first type and that from the light-receiving elements of the second, second deviation detection means for detecting a difference between the electrical signal output from the light-receiving elements of the second type and that from the light-receiving element of the third type, and ratio detection means for detecting a ratio between the two differences detected by the first and second deviation detection means.

Also, preferably, in the infrared solid-state image pickup apparatus of the present invention, the light-receiving portion is constituted by the light-receiving elements of a first type, a second type, a third type and fourth type including the optical cavity structures whose optical distances are different from each other by more than 100 nm, and wherein the arithmetic circuit includes first deviation detection means for detecting a difference between an electrical signal output from the light-receiving elements of the first type and that from the light-receiving elements of the second type, second deviation detection means for detecting a difference between an electrical signal output from the light-receiving elements of the third type and that from the light-receiving elements of the second type, and third deviation detection means for detecting a difference between an electrical signal output from the light-receiving elements of the fourth type and that from the light-receiving elements of the second type.

Also, preferably, in the infrared solid-state image pickup apparatus of the present invention, the light-receiving elements of at least one of the plurality of types include the optical cavity structures whose optical distances n·d are set such that the first light and the second light have the predetermined specific wavelength $\lambda$ satisfying a equation expressed as $\lambda=4\cdot n\cdot d/N$, using N as even number.

Further, preferably, in the infrared solid-state image pickup apparatus of the present invention, the optical cavity structures of the plurality of light-receiving elements consist of the photoelectric conversion portion formed on a first major surface of the substrate, a transparent insulating layer formed on the photoelectric conversion portion and the reflecting film formed on the a transparent insulating layer, and wherein the photoelectric conversion portions convert the first light which is incident from a second major surface opposing the first major surface of the substrate and transmitted through the substrate and, of the first light, the second light transmitted through the photoelectric conversion portion and the insulating layer and reflected by the reflecting film into electrical signals.

In this case, desirably, a difference in optical distance between the light-receiving elements of different types is determined by a difference in thickness of the insulating layer. Also, desirably, a difference in optical distance between the light-receiving elements of different types is determined by a difference in refractive index of the insulating layer.

In the infrared solid-state image pickup device and apparatus of the present invention, a plurality of light-receiving elements each including an optical cavity structure consisting of a photoelectric conversion portion formed on the first major surface of a substrate and a reflecting film formed on the photoelectric conversion portion through a transparent insulating layer are arranged on the transparent substrate, thereby forming a light-receiving portion. The photoelectric conversion portion of each light-receiving element converts incident light which is incident from the second major surface side opposing the first major surface of the substrate and transmitted through the substrate and, of the incident light, reflected light transmitted through the photoelectric conversion portion and the insulating layer and reflected by the reflecting film into electrical signals.

Giving attention to the optical cavity structure between the photoelectric conversion portion and the reflecting film, which has conventionally been used for increasing the sensitivity in the image pickup wavelength range, a light-receiving portion is constituted by arranging light-receiving elements of a plurality of types with optical cavity structures whose optical distances between the photoelectric conversion portions and the reflecting films are different. The light-receiving elements of at least one of the plurality of types have the optical cavity structures whose optical distances are set such that the incident light and the reflected light with a predetermined specific wavelength within a wavelength range mutually weaken their intensities, which wavelength range can be photoelectrically converted by the light-receiving elements of other types. With this arrangement, the optical cavity structure can obtain a function corresponding to complementary color detection in a visible range.

This infrared complementary color detection function can be formed to correspond to a desired wavelength by changing the optical distance between the photoelectric conversion portion and the reflecting film of the optical cavity structure. Therefore, when the optical distance is changed in units of light-receiving elements, light-receiving elements of a plurality of types having the infrared complementary color detection function with respect to different specific wavelengths can be obtained. When the light-receiving elements of the plurality of types having different optical distances are integrated on one light-receiving portion of the infrared solid-state image pickup device, the light-receiving portion can be divided into some wavelength bands.

For example, the light-receiving portion is constituted by light-receiving elements of two types, i.e., the first light-receiving element and the second light-receiving element, which have optical cavity structures whose optical distances are different, and the difference between an electrical signal output from the first light-receiving element and that from the second light-receiving element is detected by the deviation detection means. With this arrangement, a pseudo infrared complementary color detection mechanism having a sensitivity with respect to only a specific wavelength can be constituted.

More specifically, the light-receiving portion is constituted by the first light-receiving element having a sensitivity with respect to an infrared ray within a certain wavelength range and the second light-receiving element having a sensitivity with respect to an infrared ray within almost the same wavelength range as that for the first light-receiving element and also having a low sensitivity with respect to an infrared having a specific wavelength within the wavelength range. In this case, when the difference between the electrical signal output from the first light-receiving element and that from the second light-receiving element is detected, of the infrared received by the first light-receiving element, only an infrared component having the specific wavelength (for which the second light-receiving element has a low sensitivity) is detected. Therefore, the infrared image pickup device as a whole has a sensitivity with respect to the infrared ray having the specific wavelength. Deviation detection for detecting an electrical signal output (difference) corresponding to the received infrared ray having the specific wavelength may be performed by calculation of analog values, or calculation of values obtained by temporarily converting analog signals into digital signals.

Alternatively, the light-receiving portion is constituted by light-receiving elements of three types, i.e., the first light-receiving element, the second light-receiving element, and the third light-receiving element, which have optical cavity structures whose optical distances are different. The difference between an electrical signal output from the first light-receiving element and that from the second light-receiving element and the difference between the electrical signal output from the second light-receiving element and that from the third light-receiving element are detected by the deviation detection means. The ratio between the two differences is detected by the ratio detection means. With this arrangement, the absolute temperature of an object whose image is picked up can be obtained without receiving the influence of the emissivity.

More specifically, with this arrangement, two specific wavelengths for a low sensitivity as described above can be set. When the difference between the two electrical signal outputs is detected, the light-receiving portion as a whole has a sensitivity for two different specific wavelengths. For one object, when a predetermined relationship between the ratio between the two differences and the temperature can be detected, the temperature of the object can be accurately detected by obtaining this ratio.

As described above, when different optical structures are to be constituted, the optical distance between the photoelectric conversion portion and the reflecting film must be changed in units of light-receiving elements of different types. More specifically, the optical distance can be changed by changing the thickness of the insulating layer between the photoelectric conversion portion and the reflecting film. When the difference in optical distance is determined by the difference in thickness of the insulating layer, the manufacturing process of the plurality of light-receiving elements is simplified because the film thickness can be adjusted using the same member (insulating layer) in film formation.

To change the optical distance between the photoelectric conversion portion and the reflecting film in units of light-receiving elements of different types, the refractive index may be changed. More specifically, different substances can be used for the insulating layer. Any substance having a transmittance with respect to an infrared ray within a desired wavelength range can be used for the insulating layer.

Even when the combination of the thickness and refractive index of the insulating layer is adjusted, an optical distance corresponding to a desired wavelength can be set, as a matter of course.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description

BRIEF DESCRIPTION OF THE DRAWINGS

FIG. 7 is a sectional view showing a part of a structure of a first light-receiving element constituting the light-receiving portion shown in FIG. 6.

FIG. 8 is a sectional view showing a part of a structure of a second light-receiving element constituting the second light-receiving portion shown in FIG. 6.

DETAILED DESCRIPTION OF THE PREFERRED EMBODIMENTS

Figure 1:
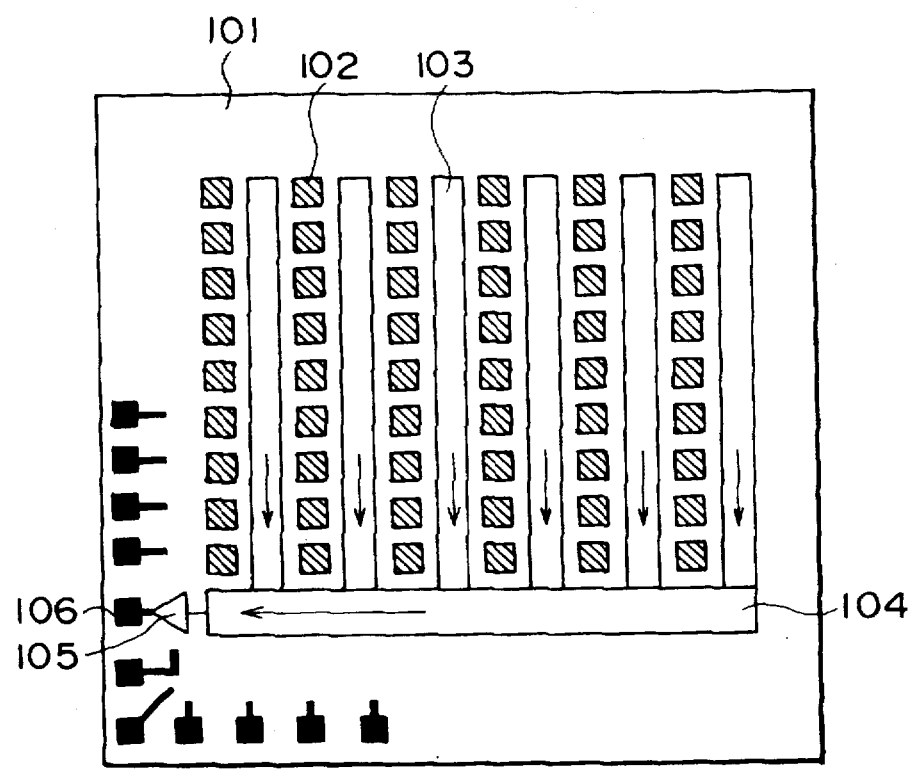
FIG. 1 is a plan view showing an overall configuration of a infrared solid-state image pickup device in accordance with a first embodiment of the present invention.

In the following, configurations and effects of various embodiments concerning the infrared solid-state image pickup device and the infrared solid-state image pickup apparatus equipped with this device of the present invention will be explained in detail with reference to FIGS. 1 to 30. In the explanation of the drawings, identical elements are referred to with identical marks without repeating their overlapping explanations. Also, dimensional ratios in the drawings do not always correspond to their explanations.

First Embodiment

As shown in FIG. 1, a plurality of light-receiving elements 102 including the photoelectric conversion portions are arranged in a matrix on a semiconductor substrate 101 to constitute a light-receiving portion. On this light-receiving portion, a plurality of vertical charge transfer portions 103 are formed along the light-receiving element arrays in gaps between the light-receiving elements to read charges generated in the respective light-receiving elements 102. In addition, a horizontal charge transfer portion 104 connected to the plurality of vertical charge transfer portions 103 is formed.

Charges from the respective light-receiving elements 102 are transferred through the vertical charge transfer portions 103 and the horizontal charge transfer portion 104 by a plurality of transfer electrodes formed on the vertical and horizontal charge transfer portions 103, 104, and output from the infrared solid-state image pickup device through an output circuit 105 serving as a charge read out circuit.

Figure 2:
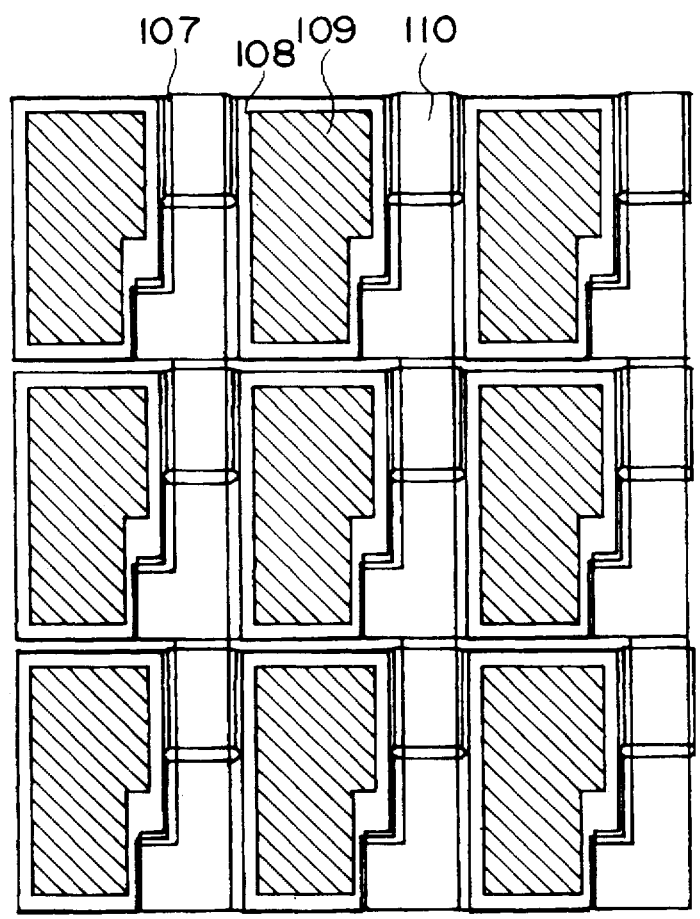
FIG. 2 is an enlarged plan view showing a part of a configuration of a light-receiving portion in the device shown in FIG. 1.

As shown in FIG. 2, for example, one region on the surface of the light-receiving portion of the infrared solid-state image pickup device includes 3×3, i.e., a total of nine light-receiving elements. As for the light-receiving elements of the light-receiving portion, p-type silicon is used for the semiconductor substrate 101, and Pt is deposited on the semiconductor substrate 101. The resultant structure is annealed to form a silicide layer of Pt and Si. A Schottky junction formed between the silicide layer and the p-type silicon is used as a photoelectric conversion portion.

Each photoelectric conversion portion present under a reflecting film 109 is surrounded by a guard ring region 108 and an isolation region 107. The light-receiving elements 102 are formed by including the guard ring region 108 and the isolation region 107, respectively. The light-receiving elements 102 are two-dimensionally arranged in a matrix, thereby constituting the light-receiving portion.

Figure 3:
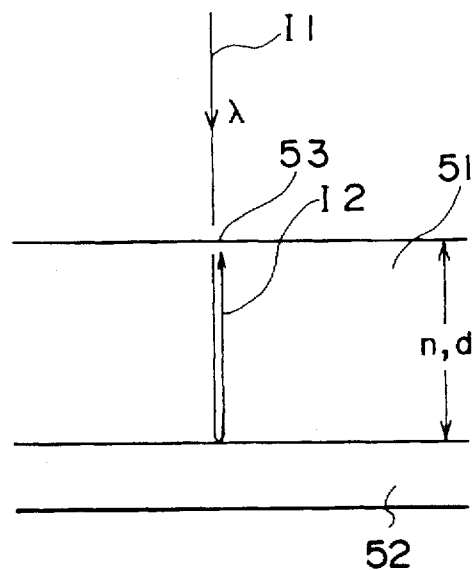
FIG. 3 is a sectional view showing a part of a structure of a light-receiving element constituting the light-receiving portion shown in FIG. 2.

As shown in FIG. 3, in an optical cavity structure of the light-receiving element 102, incident light I1 comes through the back side of the silicon substrate 101, temporarily passes through a PtSi silicide layer 53 serving as a photoelectric conversion portion, and is photoelectrically converted to generate signal charges. However, only part of the incident light I1 is photoelectrically converted. The light I2 transmitted through the PtSi silicide layer 53 is reflected by the metal reflecting film 52 by way of an insulating film 51, passes through the PtSi silicide layer 53 serving as a photoelectric conversion portion again by way of an insulating film 51, and is photoelectrically converted. Note that FIG. 3 represents the upper and lower sides of the drawing in an inverse state.

In other words, the optical cavity structure has the insulating film 51 made of a substance having a refractive index n and a thickness d. The metal reflecting film 52 for reflecting an infrared ray is formed on one surface of the insulating film 51. The photoelectric conversion portion 53 is formed on the other surface of the insulating film 51 which opposes the reflecting film 52.

Here, for the convenience of explanation, it is assumed that the insulating film 51 and the reflecting film 52 are assumed to be placed in a vacuum. In such the optical cavity structure, assume that an infrared ray having a wavelength λ is made incident perpendicularly from the surface side of the photoelectric conversion portion 53. On the photoelectric conversion portion 53, incident light I1 and return light I2 reflected by the reflecting film 52 are present. The incident light I1 and the return light I2 mutually increase their intensities on the photoelectric conversion portion 53 when they have a wavelength satisfying equations (1) and (2):

$$\lambda = 4 \cdot n \cdot d / N \quad (1)$$

$$N = 1, 3, 5, \ldots \quad (2)$$

The incident light I1 and the return light I2 mutually decrease their intensities on the photoelectric conversion portion 53 when N of equation (1) satisfies equation (3):

$$N = 2, 4, 6, \ldots \quad (3)$$

The light-receiving element of an infrared solid-state image pickup device has a photoelectric conversion portion consisting of PtSi silicide, a sensitivity up to a wavelength of about 5 µm is obtained. Light having a wavelength of about 1 µm or less is absorbed by a silicon substrate. Therefore, the light-receiving element of the infrared solid-state image pickup device has a sensitivity with respect to an infrared ray having a wavelength of 1 to 5 µm.

Since absorption by the carbon dioxide gas or water vapor occurs in outer air, the conventional infrared solid-state image pickup device using the light-receiving element with the photoelectric conversion portion of PtSi silicide generally picks up an image with a wavelength of 3 to 5 µm. Therefore, the optical cavity structure is generally set to be optimum with a wavelength of about 4 µm.

In a structure having a silicon oxide film as the insulating film 51 between the photoelectric conversion portion 53 and the reflecting film 52, assuming that n =1.4, and λ=4 µm, equation (1) yields d=0.7 µm. Therefore, for the light-receiving element of the infrared solid-state image pickup device having an optimum sensitivity with respect to a wavelength of about 4 µm, a silicon oxide film having a thickness of 0.7 to 0.8 µm can be formed between the photoelectric conversion portion 53 and the reflecting film 52. The above-described model is a simplified model, and complex calculation is required to simulate actual optical characteristics. However, this model can be sufficiently used to explain the basic operation and optimization of the optical cavity structure.

In this embodiment, the optical distance of the optical cavity structure is set in advance. For example, in the optical cavity structure with d=0.75 µm and n=1.4, an infrared ray having a certain wavelength of a wavelength band of 1 to 5 µm satisfying equations (1) and (3) causes a condition such that the incident light I1 and the return light I2 mutually decrease their intensities on the photoelectric conversion portion 53.

Figure 4:
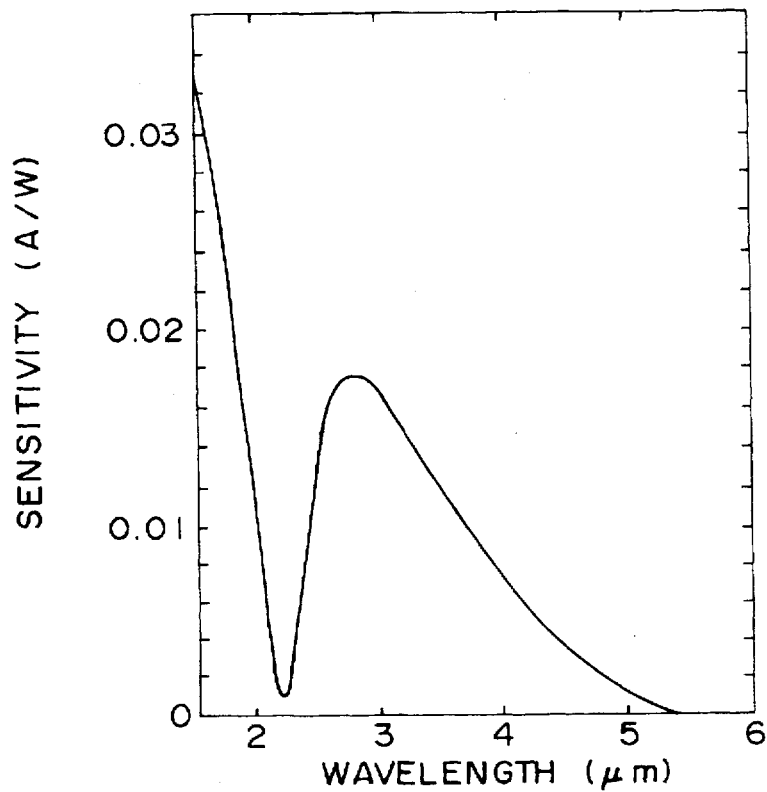
FIG. 4 is a graph showing the spectral sensitivity characteristic of the light-receiving portion in the device shown in FIG. 1 while plotting a wavelength (μm) along the abscissa and a sensitivity (A/W) along the ordinate.

FIG. 4 is shows the spectral sensitivity characteristics of the optical cavity structure. This graph plots an incident wavelength along the abscissa and, along the ordinate, a signal current (A) per unit area obtained in correspondence with light (W) with the wavelength A incident per unit area. The valley of sensitivity is generated at λ=2.1 µm, as is apparent from FIG. 4.

With this arrangement, the infrared solid-state image pickup device realizes, with respect to an infrared ray having a specific wavelength, a function (to be referred to as an infrared complementary color detection function hereinafter) corresponding to complementary color detection in a so-called visible range, though this function has conventionally been regarded as unrealizable.

The above-described infrared complementary color detection function constituted by the optical cavity structure has a periodicity as represented by equations (2) and (3). For this reason, an undesirable decrease in sensitivity is caused within the wavelength range where the light-receiving portion 53 has a sensitivity in some cases. When an optical filter is arranged on the back side of the solid-state image pickup device or in the optical system incorporating the solid-state image pickup device to limit the wavelength before image pickup light is incident on the light-receiving portion 53, the sensitivity characteristics of the portion with the undesirable decrease in sensitivity can be removed.

Second Embodiment

The infrared solid-state image pickup apparatus of this embodiment has a light-receiving portion consisting of light-receiving elements of two types having different optical distances of the optical cavity structure. The optical distances of one light-receiving element is different from that of the other light-receiving element by more than about 100 nm. This apparatus is used for a moisture meter for measuring a moisture content in a gas or an object by using an absorption band of moisture with a wavelength of 1.8 µm.

Figure 5:
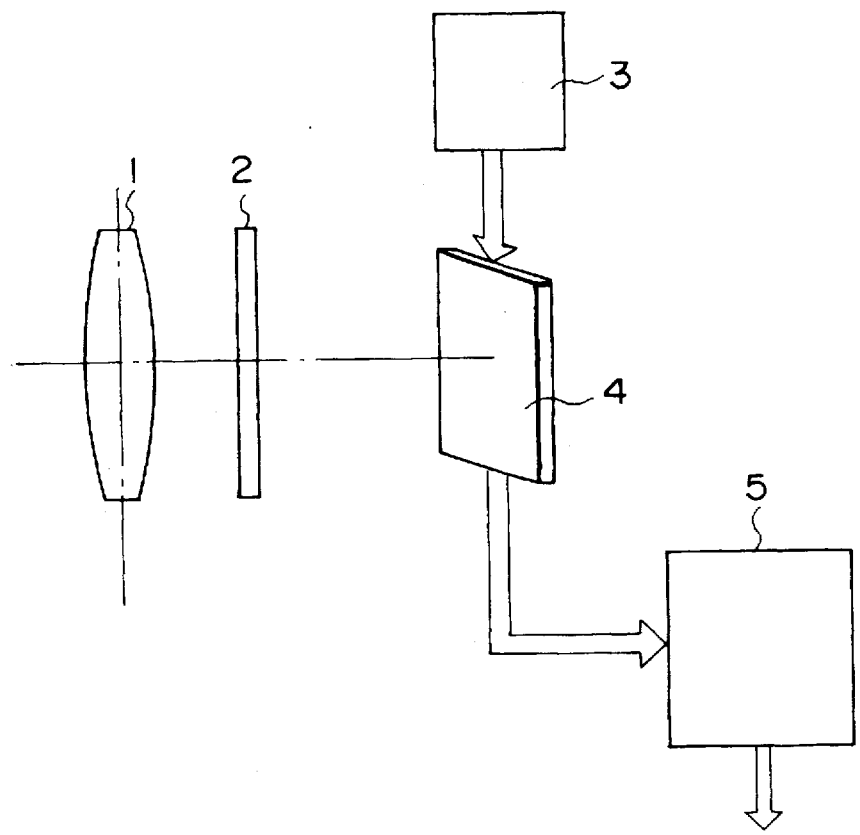
FIG. 5 is a view showing an overall configuration of a moisture meter in accordance with a second embodiment of the present invention.

As shown in FIG. 5, the infrared solid-state image pickup apparatus according to this embodiment has an imaging optical system 1, an optical filter 2 for transmitting wavelength light having a wavelength of 1.6 µm or more, a light-receiving portion 4 driven in accordance with a signal from a driving circuit 3, and a signal read out arithmetic circuit 5 serving as a deviation detection means.

As shown in FIG. 5, the light-receiving portion 4 is constituted by arranging first light-receiving elements 6 and second light-receiving elements 7, which have optical cavity structures whose optical distances are different, in a matrix on a transparent substrate such that the light-receiving elements of the same type are not adjacent to each other.

As shown in FIG. 7, the first light-receiving element 6 has an optical cavity structure constituted by a PtSi silicide layer 12 serving as a photoelectric conversion portion formed on the first major surface of a transparent substrate 11, and a reflecting film 14 formed on the PtSi silicide layer 12 through silicon oxide film 13 having the thickness of 0.46 µm and the refractive index of 1.4. As shown in FIG. 8, the second light-receiving element 7 has an optical cavity structure constituted by a PtSi silicide layer 22 serving as a photoelectric conversion portion formed on the first major surface of the transparent substrate 11, and a reflecting film 2-4 formed on the PtSi silicide layer 22 through a silicon oxide film 23 having the thickness of 0.61 µm and the refractive index of 1.4.

Figure 6:
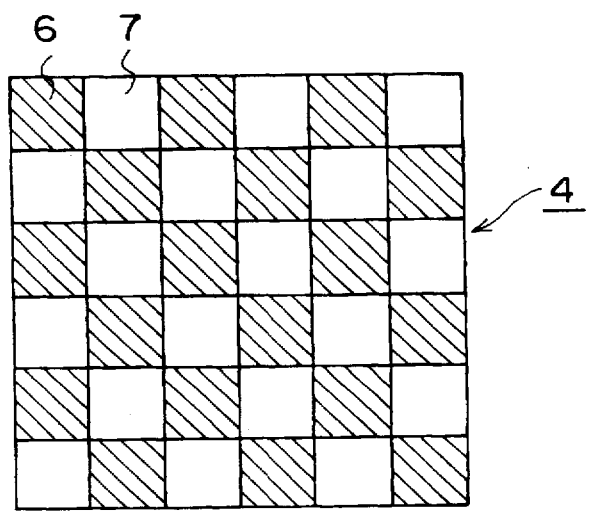
FIG. 6 is a schematic plan view showing a part of a configuration of a light-receiving portion in the meter shown in FIG. 5.

In FIG. 6, each light-receiving element is schematically represented by a square. Actually, as shown FIGS. 7 and 8, each photoelectric conversion portion (12 or 22) present under the reflecting film (14 or 24) is surrounded by a guard ring region (16 or 26) and an isolation region (15 or 25). In addition, a BCCD diffusion layer (17 or 27) is formed in a region of the substrate 11, which is separated from the photoelectric conversion portion (12 or 22) by the isolation region (15 or 25), and a CCD transfer electrode (18 or 28) consisting of polysilicon is formed on the diffusion layer (17 or 27) such that a gap between the light-receiving element arrays serves as a vertical charge transfer path.

In the infrared solid-state image pickup apparatus equipped with the above constructed light-receiving portion, electrical signals are generated from the light-receiving portion 4 in accordance with an incident infrared ray received through the imaging optical system 1 and the optical filter 2. These electrical signals are read out by the signal read out arithmetic circuit 5.

Figure 9:
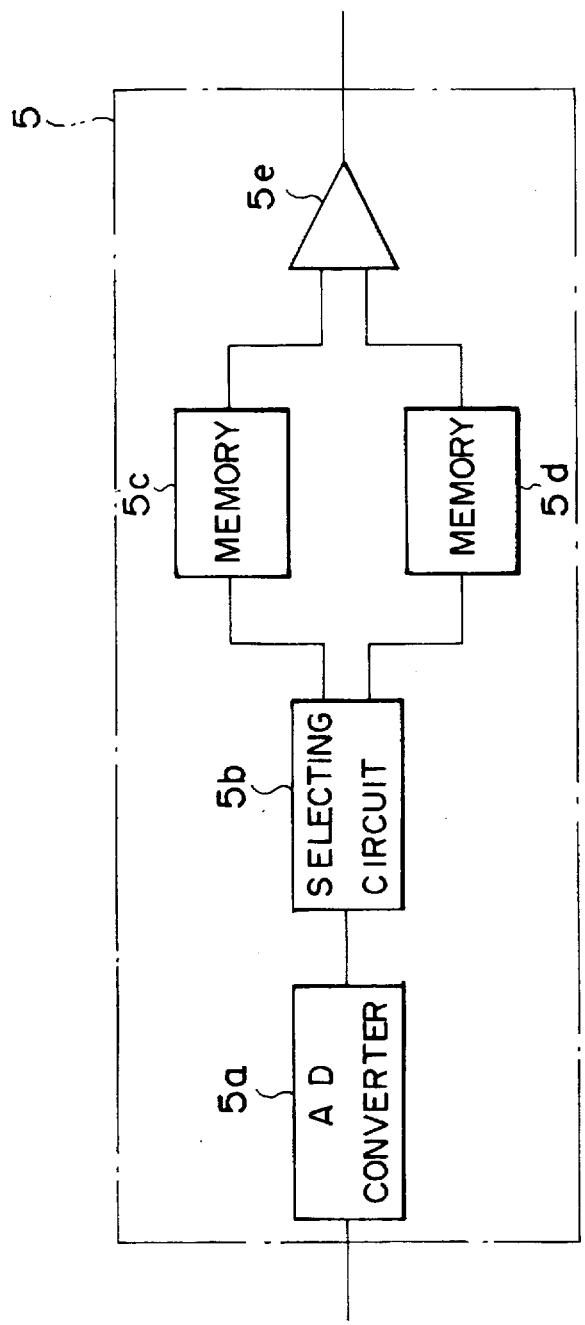
FIG. 9 is a block diagram showing a configuration of an arithmetic circuit in the meter shown in FIG. 5.

As shown in FIG. 9, in this signal read out arithmetic circuit 5, the electrical signal from the light-receiving portion 4 is analog/digital-converted by an AD converter 5a. A selecting circuit 5b separately extracts the signal component from the first light-receiving element 6 and the signal component from the second light-receiving element 7 from the signal output from the AD converter 5a, and stores the two electrical signals to a first memory 5c and a second memory 5d, respectively. A differential circuit 5e calculates the difference between the signal from the first light-receiving element 6 and that from the second light-receiving element 7 which are adjacent to each other, on the basis of data stored in the first and second memories 5c and 5d.

Figure 10:
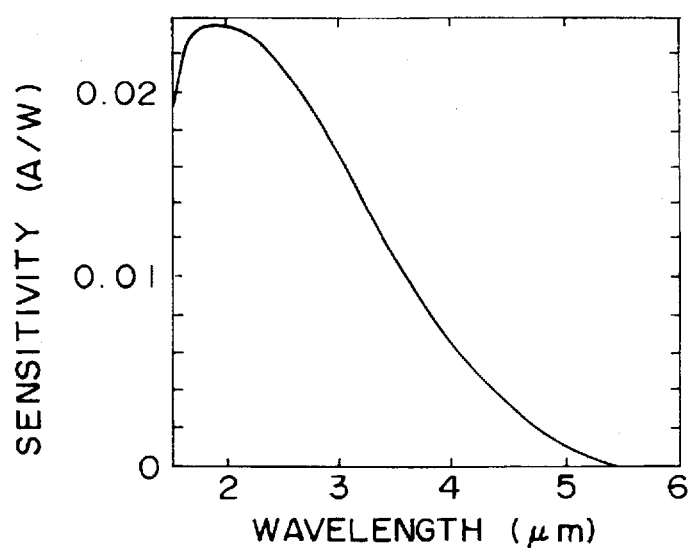
FIG. 10 is a graph showing spectral sensitivity characteristic of the first light-receiving element shown in FIG. 7 while plotting a wavelength (μm) along the abscissa and a sensitivity (A/W) along the ordinate.
Figure 11:
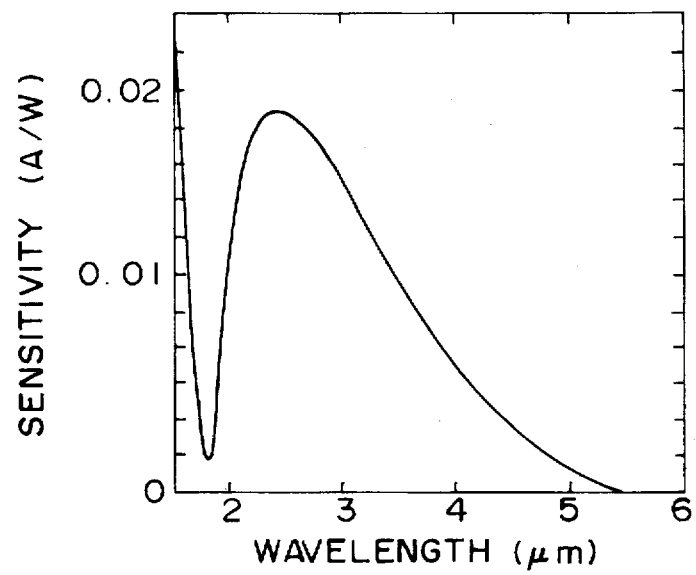
FIG. 11 is a graph showing spectral sensitivity characteristic of the second light-receiving element shown in FIG. 8 while plotting a wavelength (μm) along the abscissa and a sensitivity (A/W) along the ordinate.

The first and second light-receiving elements 6 and 7 have sensitivity characteristics with respect to infrared rays having wavelengths of 1.5 to 6 µm, as shown in FIGS. 10 and 11, in accordance with the respective optical cavity structures. Particularly, the second light-receiving element 7 exhibits a low sensitivity with respect to an infrared ray having a wavelength of about 1.8 µm.

Figure 12:
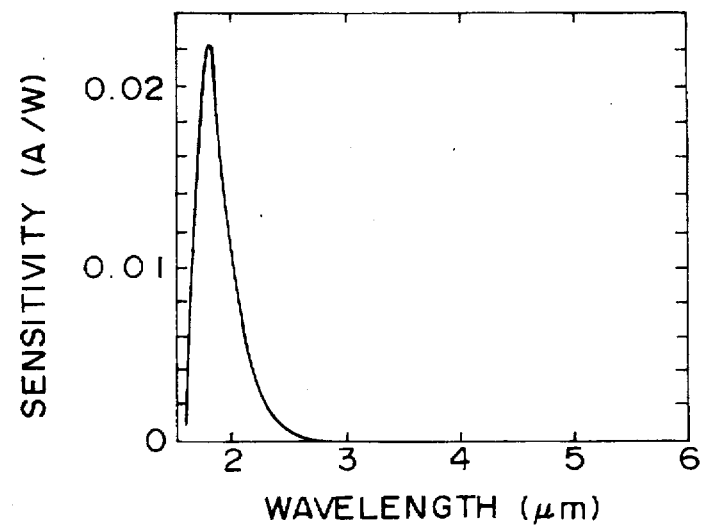
FIG. 12 is a graph showing the pseudo spectral sensitivity characteristic of the light-receiving portion in shown FIG. 6, which is obtained by an arithmetic circuit of the meter shown in FIG. 5, while plotting a wavelength (μm) along the abscissa and a sensitivity (A/W) along the ordinate.

Detection of the difference between the output signal from the light-receiving element having a spectral sensitivity shown in FIG. 10 and that from the light-receiving element having a spectral sensitivity shown in FIG. 11 corresponds to detection of an infrared ray by a light-receiving element having a sensitivity with respect to a specific wavelength band as shown in FIG. 12. More specifically, the output signal from the signal read out arithmetic circuit 5 is equivalent to an output signal from a photosensor having the characteristics of a narrow bandpass filter for transmitting only light with a wavelength of about 1.8 µm. Actually, the finally obtained output signal represents the difference between the areas of two spectral curves obtained by multiplying the respective spectral sensitivities by spectral radiant intensities.

According to the moisture meter of this embodiment, the relative sensitivity can be increased as compared to a case wherein the absorption band of moisture with a wavelength of 1.8 µm is observed with the conventional infrared solid-state image pickup device having the light-receiving portion consisting of only light-receiving element with a wide sensitivity range as shown in FIG. 10. Therefore, a small change in moisture can be obtained from a change in absorbance.

To display the detection result from the above moisture meter, of the signals from the light-receiving portion 4, only output signals from the second light-receiving elements 7 having low sensitivity characteristics with respect to a wavelength band near 1.8 µm shown in FIG. 11 are used to display an image. A moisture distribution calculated from the difference between the output signal from the first light-receiving elements 6 and that from the second light-receiving elements 7, which is obtained by the arithmetic circuit 5, is superimposed on the image. With this processing, the concentration distribution of moisture can be displayed on the picked-up image.

Third Embodiment

The infrared solid-state image pickup apparatus of this embodiment has a light-receiving portion consisting of light-receiving elements of three types having different optical distances of the optical cavity structure. The optical distances of the three light-receiving elements are different from that of the other light-receiving element by more than about 100 nm. This apparatus is used for an infrared thermometer for measuring the temperature of the object to be detected.

Figure 13:
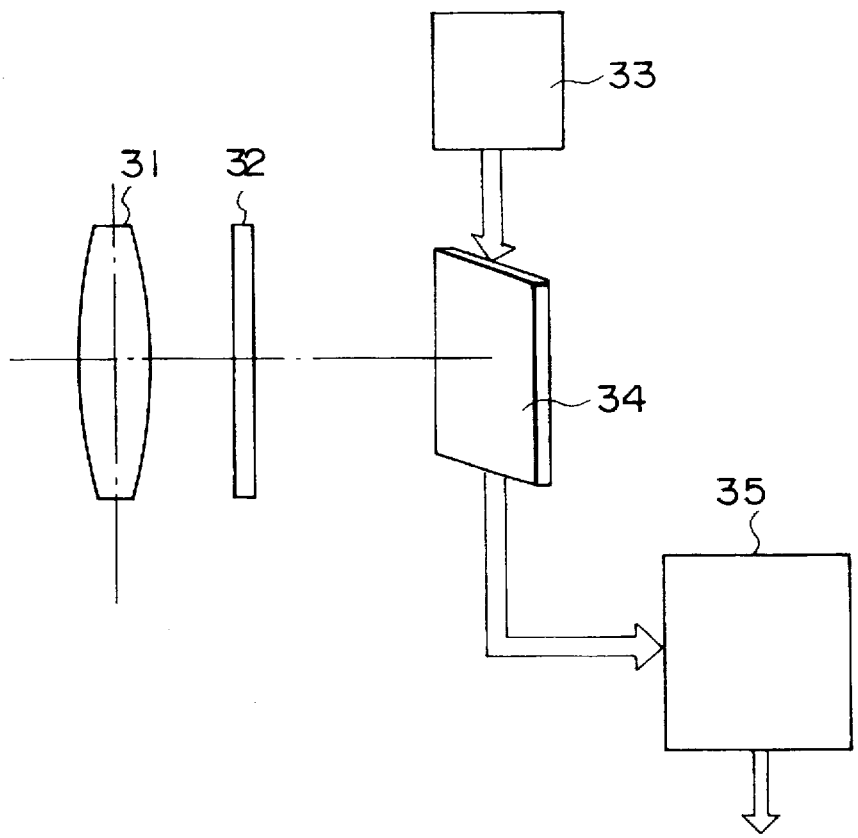
FIG. 13 is a view showing an overall configuration of an infrared thermometer in accordance with a third embodiment of the present invention.

As shown in FIG. 13, the infrared thermometer of this embodiment has an imaging optical system 31, an optical filter 32 for transmitting wavelength light having a wavelength of 3 µm or more, a light-receiving portion 34 driven in accordance with a signal from a driving circuit 33, and a signal read out arithmetic circuit 35 serving as a deviation detection means and a ratio detection means.

Figure 14:
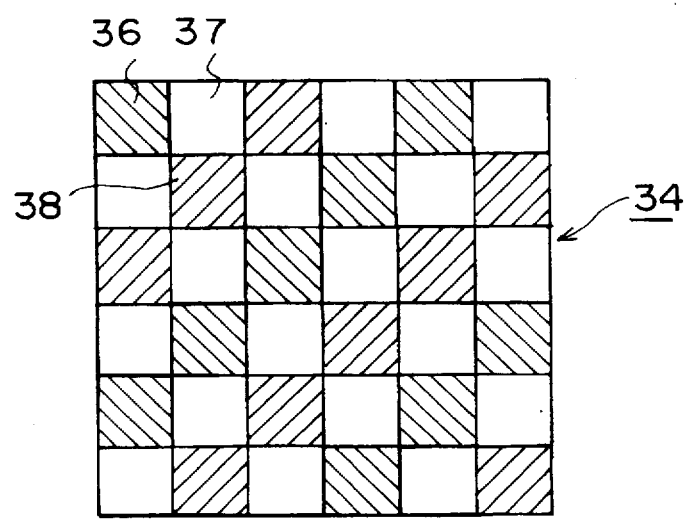
FIG. 14 is a schematic plan view showing a part of a configuration of a light-receiving portion in the meter shown in FIG. 13.

As shown in FIG. 14, the light-receiving portion 34 is constituted by arranging first light-receiving elements 36, second light-receiving elements 37, and third light-receiving elements 38, which have optical cavity structures whose optical distances are different, in a matrix on a transparent substrate such that the light-receiving elements of the same type are not adjacent to each other.

The first, second, and third light-receiving elements (36, 37, and 38) have the same structures as that of the light-receiving element (FIGS. 7 and 8) used in the second embodiment, i.e., an optical structure constituted by a PtSi silicide layer serving as a photoelectric conversion portion formed on the first major surface of the transparent substrate, and a reflecting film formed on the PtSi silicide layer through a silicon oxide film having a predetermined thickness and the refractive index of 1.4. In this embodiment, the thickness of the silicon oxide film as an optical cavity structure is set to be 1.25 µm for the first light-receiving element 36, 0.75 µm for the second light-receiving element 37, or 1.75 µm for the third light-receiving element 38.

In FIG. 14, each light-receiving element is schematically represented by a square. Actually, each photoelectric conversion portion present under the reflecting film is surrounded by a guard ring region and an isolation region. In addition, a BCCD diffusion layer is formed in a region of the substrate, which is separated from the photoelectric conversion portion by the isolation region, and a CCD transfer electrode consisting of polysilicon is formed on the diffusion layer such that a gap between the light-receiving element arrays serves as a vertical charge transfer path.

In the infrared thermometer with the above structure, an infrared ray from the object is incident on the light-receiving portion 34 through the imaging optical system 31 and the optical filter 32. Electrical outputs according to the incident infrared dose are generated from the light-receiving portion 34. These electrical signals are read out and analog/digital-converted by the arithmetic circuit 35.

Figure 15:
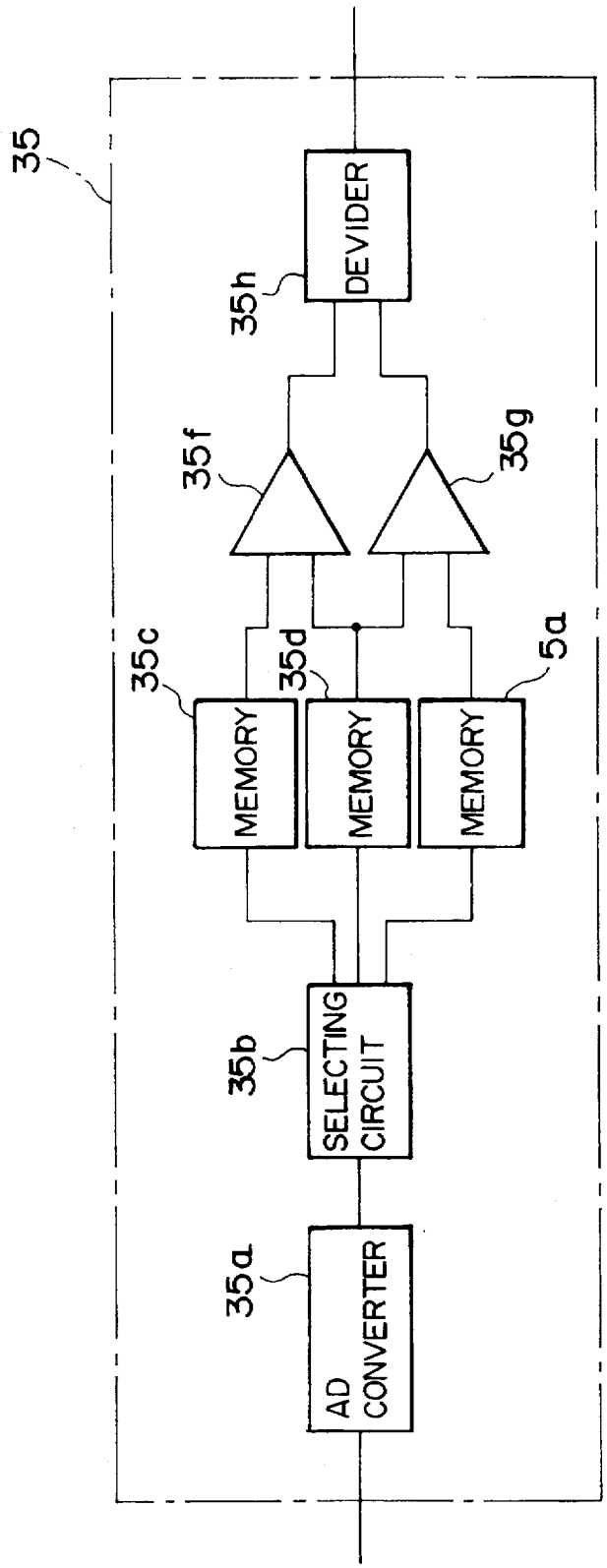
FIG. 15 is a block diagram showing a configuration of an arithmetic circuit in the thermometer shown in FIG. 13.

As shown in FIG. 15, in this signal read out arithmetic circuit 35, the electrical signal from the light-receiving portion 34 is analog/digital-converted by an AD converter 35a. A selecting circuit 35b separately extracts the signal components from the first, second and third light-receiving elements 36, 37 and 38 from the signal output from the AD converter 35a, and stores the three electrical signals to a first memory 35c, a second memory 35d and a third memory 35e, respectively.

A first differential circuit 35f calculates the difference between the signal from the first light-receiving element 36 and that from the second light-receiving element 37 which are adjacent to each other, on the basis of data stored in the first and second memories 35c and 35d. A second differential circuit 35g calculates the difference between the signal from the second light-receiving element 37 and that from the third light-receiving element 38 which are adjacent to each other, on the basis of data stored in the second and third memories 35d and 35e. A divider 35h calculates the ratio of the signal from the first differential circuit 35f and the signal from the second differential circuit 35g.

Figure 16:
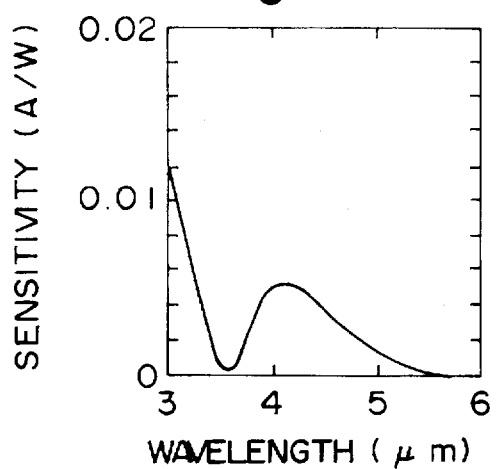
FIG. 16 is a graph showing a spectral sensitivity characteristic of the first light-receiving element shown in FIG. 14 while plotting a wavelength (μm) along the abscissa and a sensitivity (A/W) along the ordinate.
Figure 17:
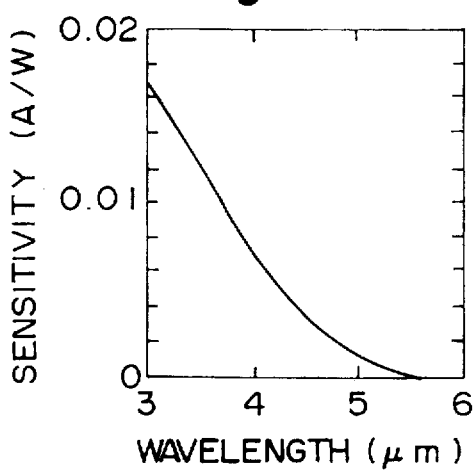
FIG. 17 is a graph showing spectral sensitivity characteristic of the second light-receiving element shown in FIG. 14 while plotting a wavelength (μm) along the abscissa and a sensitivity (A/W) along the ordinate.
Figure 18:
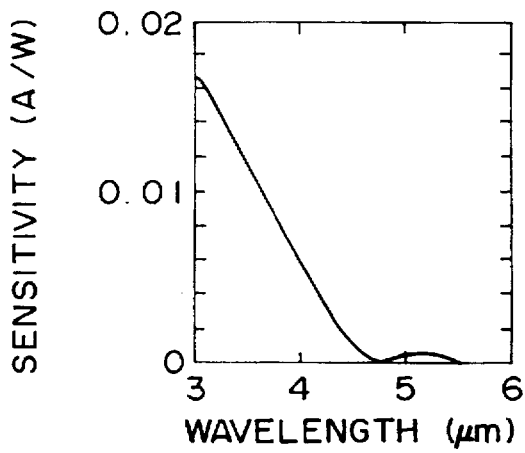
FIG. 18 is a graph showing a spectral sensitivity characteristic of the third light-receiving element shown in FIG. 14 while plotting a wavelength (μm) along the abscissa and a sensitivity (A/W) along the ordinate.

The first, second, and third light-receiving elements (36, 37, and 38) have spectral sensitivity characteristics shown in FIGS. 16 to 18, respectively, in accordance with the optical distances of the optical cavity structures. The first light-receiving element 36 has characteristics representing a low sensitivity for an infrared ray having a wavelength of about 3.5 µm. The third light-receiving element 38 has characteristics representing a low sensitivity for an infrared ray having a wavelength of about 4.7 µm.

Figure 19:
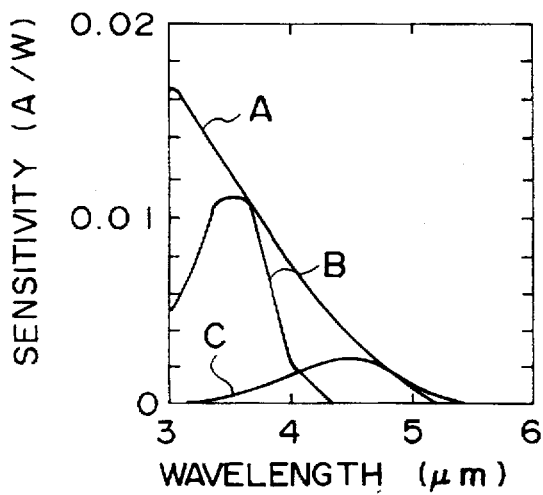
FIG. 19 is a graph showing the pseudo spectral sensitivity characteristic of the light-receiving portion in shown FIG. 13, which is obtained by an arithmetic circuit of the thermometer shown in FIG. 15, while plotting a wavelength (μm) along the abscissa and a sensitivity (A/W) along the ordinate.

Therefore, as shown in FIG. 19, detection of an infrared ray by the light-receiving portion 34 corresponds to detection by a photosensor having a spectral sensitivity characteristic B with a peak sensitivity for an infrared ray with a wavelength of about 3.5 μm and a spectral sensitivity characteristic C with a peak sensitivity for an infrared ray with a wavelength of about 4.7 μm. FIG. 19 also shows a spectral sensitivity characteristic A of the second light-receiving element 37 as a reference.

Figure 20:
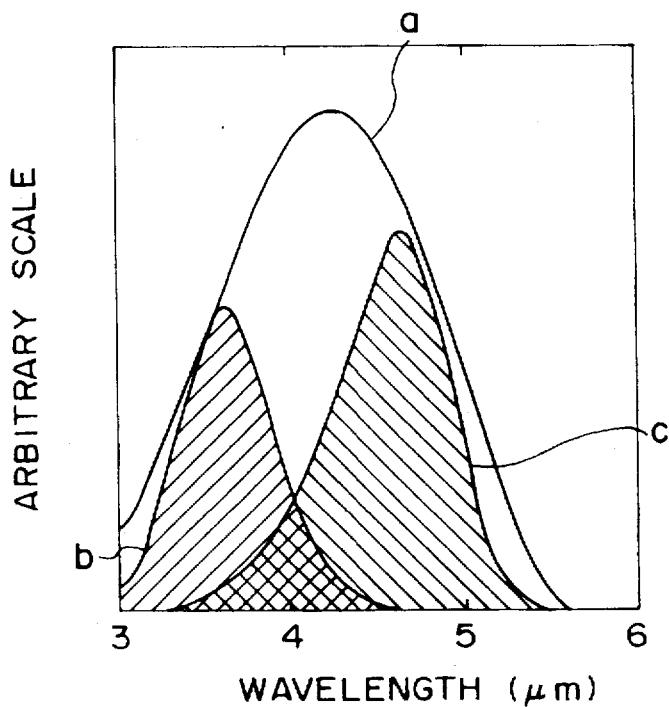
FIG. 20 is a graph showing spectral output characteristics obtained by the arithmetic circuit of the thermometer shown in FIG. 15, in correspondence with the spectral sensitivity characteristics shown in FIG. 19 while plotting a wavelength (μm) along the abscissa and an arbitrary scale along the ordinate.
Figure 21:
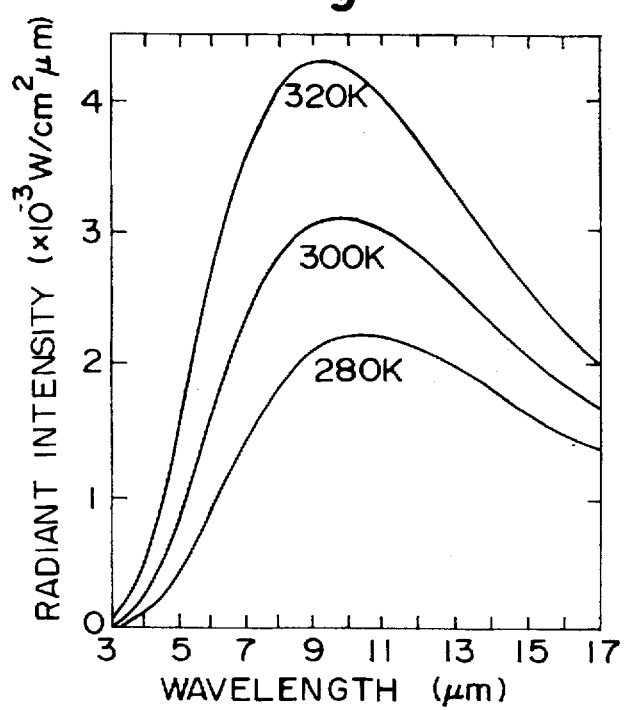
FIG. 21 is a graph showing the spectral radiant intensities of a black body used for the thermometer shown in FIG. 13, while plotting a wavelength (μm) along the abscissa and a radiant intensity ($\times 10^{-3}$ W/cm$^2$μm) along the ordinate.

When an object at 300K is observed with the infrared thermometer with the above structure, an output obtained by the above calculation exhibits output characteristics shown in FIG. 20. This graph has a wavelength (μm) along the abscissa and an arbitrary scale along the ordinate. This graph relatively shows signal outputs obtained in the direction of wavelength when the infrared ray radiated from a black body at 300K is photoelectrically converted by the light-receiving portion 34 having the spectral sensitivity characteristics A, B, and C shown in FIG. 19. In fact, the signal outputs are obtained by multiplying the spectral sensitivity characteristics A, B, and C by the radiant intensity (shown in FIG. 21) of the infrared ray from the black body at 300K.

Therefore, as a result of calculation of the signals from the light-receiving portion 34 having the spectral sensitivity characteristics A, B, and C, currents corresponding to areas between three curves a to c and the abscissa in FIG. 20 are obtained as signals in the arithmetic circuit 35. More specifically, the output (c) as the difference between the output signal from the second light-receiving element 37 and that from the third light-receiving element 38 corresponds to the area c in FIG. 20. The output (b) as the difference between the output signal from the second light-receiving element 37 and that from the first light-receiving element 36 corresponds to the area b in FIG. 20. The output signal (a) from the second light-receiving element 37 corresponds to the area a in FIG. 20.

Figure 22:
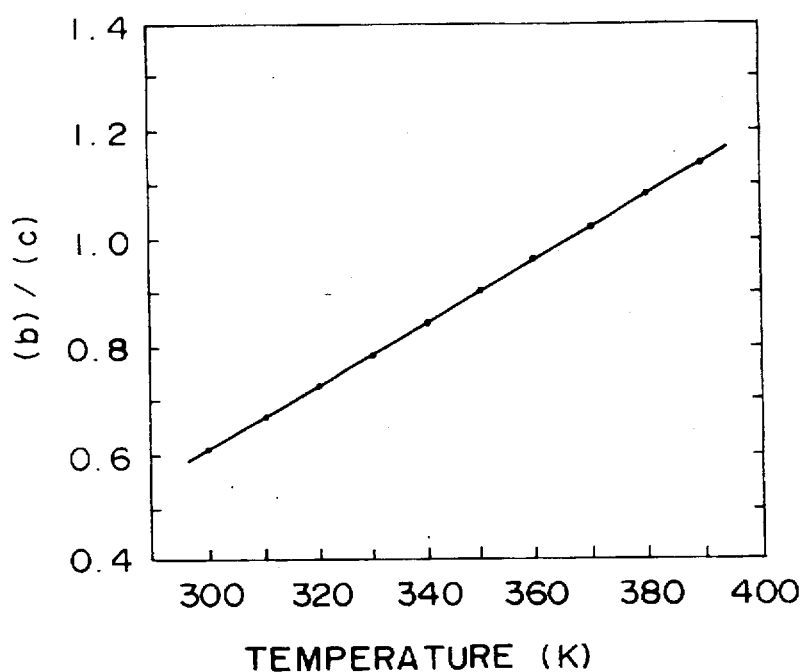
FIG. 22 is a graph showing the temperature characteristic of the infrared thermometer according to the second embodiment while plotting a temperature (K) along the abscissa and the ratio of two differential outputs from the arithmetic circuit along the ordinate.

Subsequently, the ratio (b)/(c) of the resultant output (b) to the output (c) is calculated by the arithmetic circuit 35. Similarly, the ratio (b)/(c) at different absolute temperatures of the object is calculated. As a result, as shown in FIG. 22, a predetermined relationship is established between the absolute temperature and the ratio (b)/(c). This graph has the absolute temperature of the object along the abscissa and the ratio (b)/(c) along the ordinate. Therefore, the temperature of the object can be measured by obtaining the ratio (b)/(c) on the basis of this relationship. The emissivity of an object can often be regarded as a constant value within a small wavelength range. With the method of this embodiment, the temperature of the object can be detected independently of the value of the emissivity.

Fourth Embodiment

The infrared solid-state image pickup apparatus of this embodiment has a light-receiving portion consisting of light-receiving elements of four types having different optical distances of the optical cavity structure. The optical distances of the four light-receiving elements are different from that of the other light-receiving element by more than about 100 nm. This apparatus is suitable for color display of an infrared image.

Figure 23:
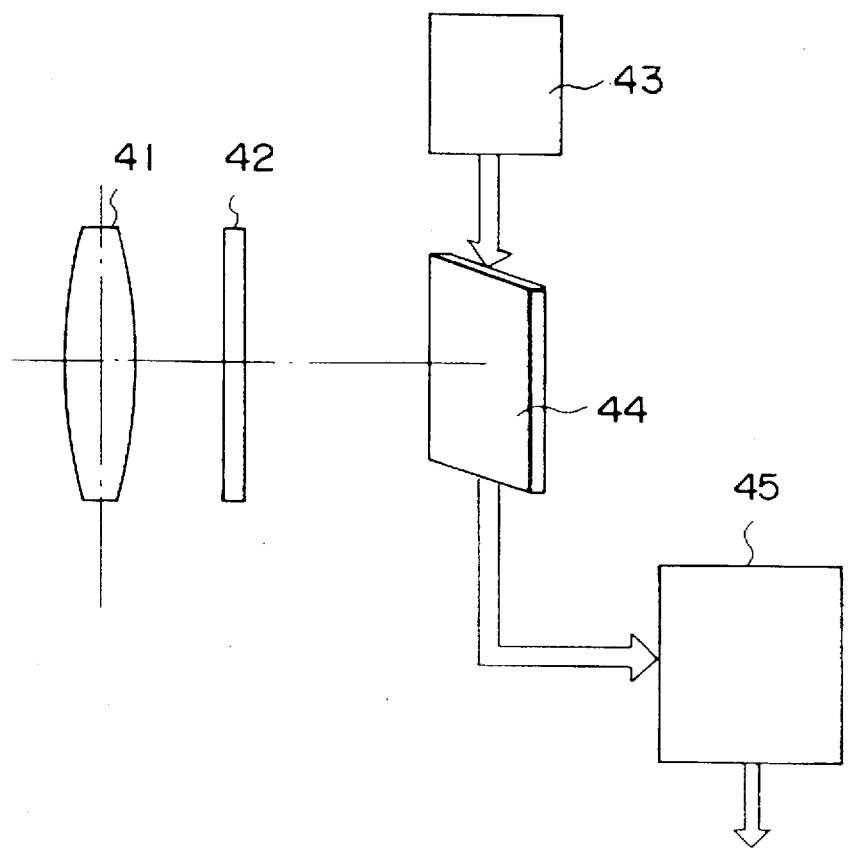
FIG. 23 is a view showing an overall configuration of an infrared solid-state image pickup apparatus in accordance with a fourth embodiment of the present invention.

As shown in FIG. 23, the infrared solid-state image pickup apparatus of this embodiment has an imaging optical system 41, an optical filter 42 for transmitting wavelength light having a wavelength of 3 μm or more, a light-receiving portion 44 driven in accordance with a signal from a driving circuit 43, and a signal read out arithmetic circuit 45 serving as a deviation detection means.

Figure 24:
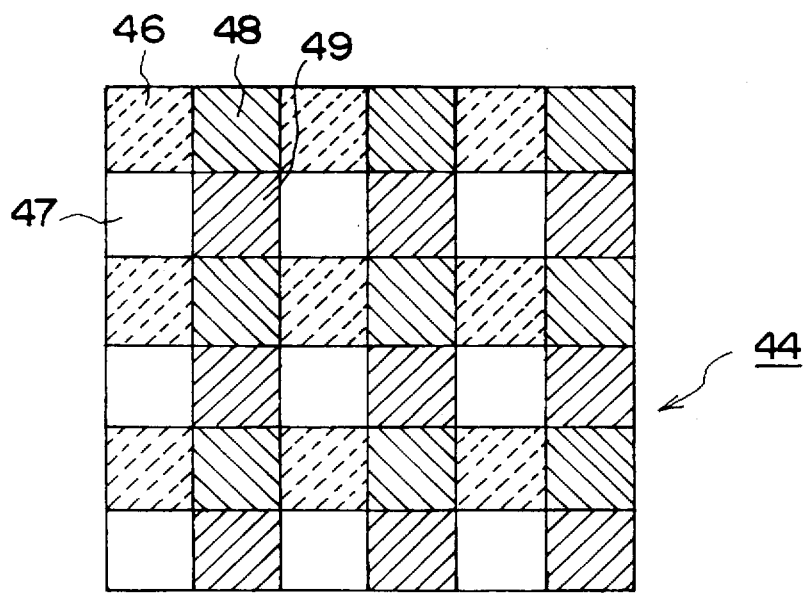
FIG. 24 is a schematic plan view showing a part of a configuration of a light-receiving portion in the apparatus shown in FIG. 23.

As shown in FIG. 24, the light-receiving portion 44 of this embodiment is constituted by arranging first light-receiving elements 46, second light-receiving elements 47, third light-receiving elements 48, and fourth light-receiving elements 49, which have optical cavity structures whose optical distances are different, in a matrix on a transparent substrate such that the light-receiving elements of the same type are not adjacent to each other.

The first, second, third, and fourth light-receiving elements (46, 47, 48, and 49) have the same structure as that of the light-receiving element (FIGS. 7 and 8) used in the second embodiment, i.e., an optical structure constituted by a PtSi silicide layer serving as a photoelectric conversion portion formed on the first major surface of the transparent substrate, and a reflecting film formed on the PtSi silicide layer through a silicon oxide film having a predetermined thickness and the refractive index of 1.4. In this embodiment, the thickness of the silicon oxide film as an optical cavity structure is set to be 1.75 μm for the first light-receiving element 46, 0.75 μm for the second light-receiving element 47, 1.50 μm for the third light-receiving element 48, or 1.25 μm for the fourth light-receiving element 49.

In FIG. 24, each light-receiving element is schematically represented by a square. Actually, each photoelectric conversion portion present under the reflecting film is surrounded by a guard ring region and an isolation region. In addition, a BCCD diffusion layer is formed in a region of the substrate, which is separated from the photoelectric conversion portion by the isolation region, and a CCD transfer electrode consisting of polysilicon is formed on the diffusion layer such that a gap between the light-receiving element arrays serves as a vertical charge transfer path.

In the infrared solid-state image pickup apparatus with the above structure, an infrared ray from the object is incident on the light-receiving portion 44 through the imaging optical system 41 and the optical filter 42. Electrical outputs according to the incident infrared dose are generated from the light-receiving portion 44. These electrical signals are read out and analog/digital-converted by the arithmetic circuit 45.

Figure 25:
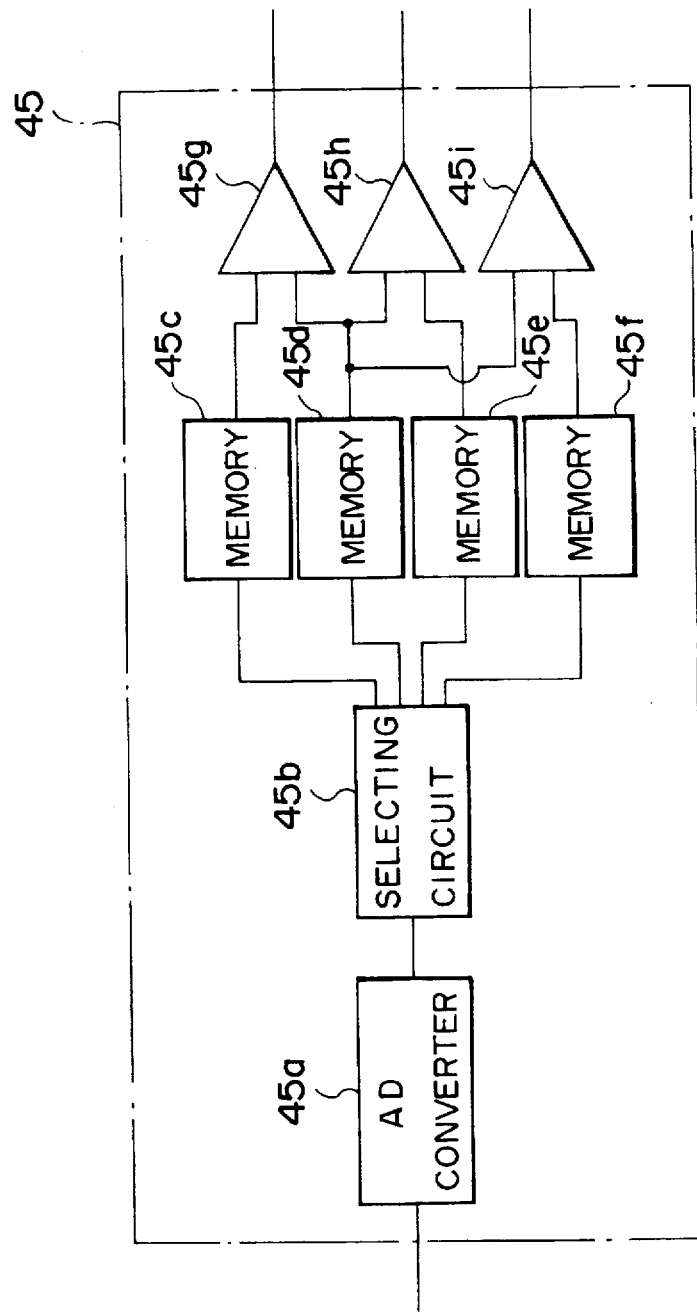
FIG. 25 is a block diagram showing a configuration of an arithmetic circuit in the apparatus shown in FIG. 23.
Figure 26:
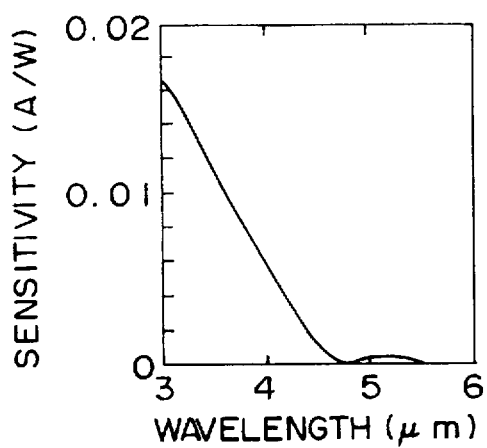
FIG. 26 is a graph showing a spectral sensitivity characteristic of the first light-receiving element shown in FIG. 24 while plotting a wavelength (μm) along the abscissa and a sensitivity (A/W) along the ordinate.
Figure 27:
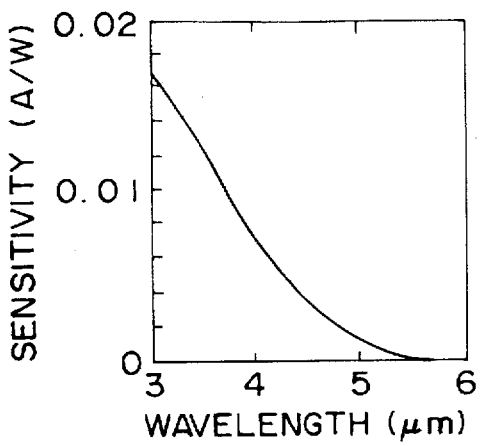
FIG. 27 is a graph showing spectral sensitivity characteristic of the second light-receiving element shown in FIG. 24 while plotting a wavelength (μm) along the abscissa and a sensitivity (A/W) along the ordinate.
Figure 28:
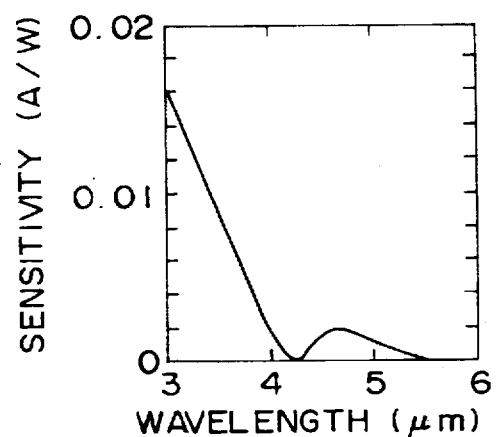
FIG. 28 is a graph showing spectral sensitivity characteristic of the third light-receiving element shown in FIG. 24 while plotting a wavelength (μm) along the abscissa and a sensitivity (A/W) along the ordinate.
Figure 29:
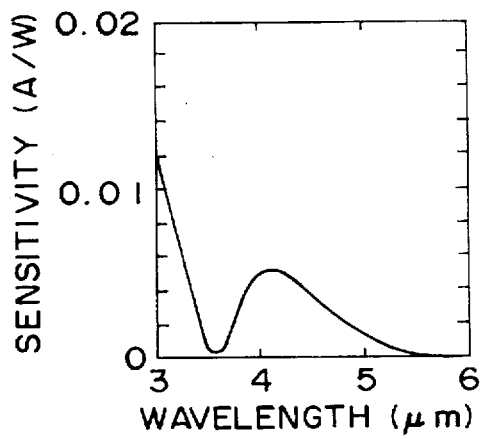
FIG. 29 is a graph showing spectral sensitivity characteristic of the fourth light-receiving element shown in FIG. 24 while plotting a wavelength (μm) along the abscissa and a sensitivity (A/W) along the ordinate.

As shown in FIG. 25, in this signal read out arithmetic circuit 45, the electrical signal from the light-receiving portion 44 is analog/digital-converted by an AD converter 45a. A selecting circuit 45b separately extracts the signal components from the first, second, third and fourth light-receiving elements 46, 47, 48 and 49 from the signal output from the AD converter 45a, and stores the three electrical signals to a first memory 45c, a second memory 45d, a third memory 45e and a fourth memory 45f, respectively.

A first differential circuit 45g calculates the difference between the signal from the first light-receiving element 46 and that from the second light-receiving element 47 which are adjacent to each other, on the basis of data stored in the first and second memories 45c and 45d. A second differential circuit 45h calculates the difference between the signal from the second light-receiving element 47 and that from the third light-receiving element 48 which are adjacent to each other, on the basis of data stored in the second and third memories 45d and 45e. A third differential circuit 45i calculates the difference between the signal from the second light-receiving element 47 and that from the fourth light-receiving element 49 which are adjacent to each other, on the basis of data stored in the second and fourth memories 45d and 45f.

The first, second, third, and fourth light-receiving elements (46, 47, 48, and 49) have spectral sensitivity characteristics shown in FIGS. 26 to 29, respectively, in accordance with the optical distances of the optical cavity structures. The first light-receiving element 46 has a characteristic representing a low sensitivity for an infrared ray having a wavelength of about 4.7 μm. The third light-receiving element 48 has a characteristic representing a low sensitivity for an infrared ray having wavelength of about 4.2 μm. In addition, the fourth light-receiving element 49 has a characteristic representing a low sensitivity for an infrared ray having wavelength of about 3.5 μm.

Figure 30:
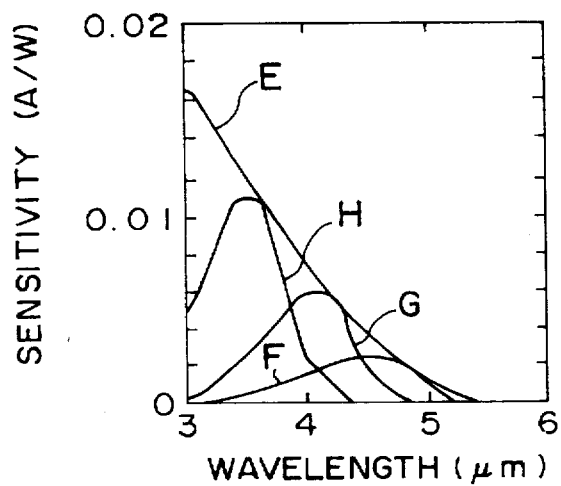
FIG. 30 is a graph showing the pseudo spectral sensitivity characteristic of the light-receiving portion in shown FIG. 23, which is obtained by an arithmetic circuit of the FIG. 25, while plotting a wavelength (μm) along the abscissa and a sensitivity (A/W) along the ordinate.

Therefore, as shown in FIG. 30, detection of an infrared ray by the light-receiving portion 44 corresponds to detection by a photosensor having a spectral sensitivity characteristic H having a peak sensitivity for an infrared ray with a wavelength of about 3.5 μm, a spectral sensitivity characteristic F having a peak sensitivity for an infrared ray with a wavelength of about 4.7 μm, and a spectral sensitivity characteristic G having a peak sensitivity for an infrared ray with a wavelength of about 4.2 μm. FIG. 30 also shows a spectral sensitivity characteristic E of the second light-receiving element 47 as a reference.

The light-receiving region exhibiting sensitivities with respect to three wavelength bands can equivalently have the same arrangement as that of a complementary color checkerboard filter used for a solid-state image pickup device for a visible range. When the three difference outputs from the light-receiving portion 44 are caused to correspond to the three complementary colors in the visible range, an infrared image having a wavelength of 3 to 6 μm can be easily displayed as a color image without using any special signal processing circuit.

Fifth Embodiment

A method of manufacturing the light-receiving portion consisting of light-receiving elements of a plurality of types used in the first to fourth embodiments will be described below with reference to FIGS. 7 and 8.

First, a well-known LOCOS isolation method (selective oxidation isolation method) is used to form the isolation region (15 or 25) consisting of a relatively thick thermal oxide film on the silicon substrate 11.

The BCCD diffusion layer (17 or 27) is formed in the charge transfer portion, and the CCD transfer electrode (18 or 28) consisting of polysilicon is formed on the diffusion layer (17 or 27). In addition, the n-type impurity diffusion layer (16 or 26) serving as a guard ring region, all the various thermal diffusion layers such as source and drain diffusion layers constituting a MOS transistor as the output portion of the charge transfer portion, and all polysilicon electrodes are formed (none are shown).

Photolithography is performed to form the photoelectric conversion portion. After formation of the electrodes, the surface of the substrate 11 is coated with a resist. Next, exposure and development are performed to pattern the resist, thereby protecting, with the resist, regions other than active regions serving as the effective light-receiving regions of the light-receiving elements.

Subsequently, a hole is formed in the oxide film in a region other than the resist pattern by wet etching to expose the surface of the silicon substrate 11 in the element active region, and thereafter, removal of the resist and cleaning of the substrate are performed. The photoelectric conversion portion (12 or 22) is formed next. In formation of the photoelectric conversion portion (12 or 22), Pt is deposited on the exposed surface of the silicon substrate 11 first. Annealing is performed to form the PtSi layer. With these processes, the photoelectric conversion portion (12 or 22) consisting of a Schottky barrier diode is formed.

The 0.46 μm thick insulating film 13 which can be obtained at a relatively low temperature of about 500° C. or less is formed on the entire surface. This insulating film 13 can be appropriately selected from various films including an oxide film, a nitrooxide film, and a nitride film formed by atmospheric pressure CVD, plasma CVD, low-pressure CVD, or sputtering. Since the refractive index of the insulating film 13 changes depending on the type of the film, the film thickness is set such that the optical cavity structure obtains a desired optical distance.

After the insulating film 13 is formed, the reflecting film 14 is formed of, e.g., aluminum or an aluminum alloy on the surface of the insulating film 13 on the photoelectric conversion portion 12 at a position corresponding to the light-receiving element 6 shown in FIG. 6, thereby obtaining an optical cavity structure having a section shown in FIG. 7.

Thereafter, a 0.15 μm thick insulating film 19 which can be obtained at a relatively low temperature of about 500° C. or less is additionally formed on the entire surface. This additionally formed insulating film 19 can be formed by a similar method as that for the insulating film 13. At this time, an insulating film 23 constituted by the two insulating layers 13 and 19 has been formed on a region of the photoelectric conversion portion 12 at a position corresponding to the light-receiving element 7 shown in FIG. 6. The insulating film 23 has a thickness of 0.61 μm.

After the insulating film 23 is formed, the reflecting film 24 is formed of, e.g., aluminum or an aluminum alloy on the surface of the insulating film 23 on the photoelectric conversion portion 22, thereby obtaining an optical cavity structure having a section shown in FIG. 8. Finally, an insulating film (20a or 30a) for protecting the surface, and as needed, a metal wiring layer (20b or 30b) and an anti-reflection coating 10 are formed. With these processes, an infrared solid-state image pickup device can be constituted.

When a light-receiving portion consisting of light-receiving elements of a plurality of types having optical cavity structure whose optical distances are different is to be formed, and the difference in optical distance is to be determined by changing the geometrical distance between the photoelectric conversion portion and the reflecting film, formation of the insulating film and the reflecting film thereon, and formation of the additional insulating film must be repeated in the order of increasing the set film thickness.

Here, without being restricted to the above-mentioned embodiments, the present invention can be modified in various manners. For example, the arrangement of the different light-receiving elements of the light-receiving portion used in each of the above embodiment is only an example, and another arrangement can also be used to obtain the effect of the present invention, as a matter of course.

In the above embodiments, the optical distance of the optical structure is determined in accordance with the thickness of the insulating film between the photoelectric conversion portion and the reflecting film. However, the optical distance can be determined in accordance with the refractive index of the substance (insulating film) between the photoelectric conversion portion and the reflecting film, or the combination of the film thickness and the refractive index. For example, when a silicon nitride film having a refractive index n of 2 is used with respect to a silicon oxide film having a refractive index n of 1.4, the optical distance can be increased by 1.4 times without increasing the geometrical distance between the photoelectric conversion portion and the reflecting film.

In addition, for the light-receiving portion of the above-described infrared solid-state image pickup device, the photoelectric conversion portion is formed as a Schottky junction between the silicon semiconductor serving as a transparent substrate and the PtSi silicide produced upon reaction between Pt and the silicon semiconductor. However, in addition to PtSi, Pd₂Si, IrSi, or palladium silicide can be used as a silicide. Furthermore, the photoelectric conversion portion is not limited to the Schottky junction. The present invention can be effectively applied to a light-receiving portion consisting of light-receiving elements having an optical cavity structure as described in FIG. 3.

Also, the present invention is not limited to the light-receiving portion constituted by light-receiving elements of two or four types having optical cavity structures whose optical distances are different. For example, a solid-state image pickup device having a light-receiving portion constituted by light-receiving element of five types can also be realized, which obtains a sensitivity for four specific wavelengths by detecting four differences. The light-receiving portion can be constituted by light-receiving elements of multiple (five or more) types as needed, as a matter of course.

Further, the infrared solid-state image pickup device according to the present invention is not limited to the interline transfer type CCD as shown in FIG. 1. As a means for extracting signal charges generated in the light-receiving portion from the solid-state image pickup device, i.e., a signal transfer/read means, a means of any type can be used. For example, a means of a CCD (Charge Coupled Device) type, a CSD (Charge Sweeping Device), or a MOS type can be employed.

As has been described above, according to the present invention, light-receiving elements constituting the light-receiving portion of an infrared solid-state image pickup device have a structure which enables control of a wavelength sensitivity with different wavelength sensitivities. For this reason, the light-receiving elements can obtain, in an infrared range, a function corresponding to complementary color detection in a so-called visible range, which is conventionally unrealizable.

Therefore, an infrared thermometer which can detect an absorption or emission spectrum with a specific wavelength at a high sensitivity and accurately measure the absolute temperature of an object independently of the emissivity can be constituted. In addition, an infrared image can be displayed as a color image based on not only an infrared dose but also an accurate temperature distribution.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

The basic Japanese Application No. 244877/1994 filed on Sep. 14, 1994 is hereby incorporated by reference.

What is claimed is:

1. An infrared solid-state image pickup device comprising:
    a substrate which is transparent with respect to infrared light;
    a first light receiving element formed on said substrate and including
    a first photoelectric conversion portion formed on a first major surface of said substrate,
    a first infrared transparent insulating layer formed on said first photoelectric conversion portion, and
    a first reflecting layer formed on said first infrared transparent insulating layer,
    a first optical cavity with a first predetermined optical distance being formed between said first photoelectric conversion portion and said first reflecting layer; and
    a second light receiving element formed on said substrate and including
    a second photoelectric conversion portion formed on said first major surface of said substrate,
    a second infrared transparent insulating layer formed on said second photoelectric conversion portion, and
    a second reflecting layer formed on said second infrared transparent insulating layer,
    a second optical cavity with a second predetermined optical distance, which is different from said first predetermined optical distance by more than 100 nm, being formed between said second photoelectric conversion portion and said second reflecting layer;
    wherein said first predetermined optical distance is set such that a valley in sensitivity to light incident to said first optical cavity exists at a predetermined wavelength within a predetermined wavelength range in a sensitivity curve of said first optical cavity, and
    light within said wavelength range being photoelectrically convertible by said second light receiving element, and
    wherein said first and second photoelectric conversion portions convert light incident from a second major surface of said substrate, which is opposite to said first major surface, and transmitted through said substrate.

2. An infrared solid-state image pickup device according to claim 1, wherein said first optical cavity has an optical distance n·d set such that light having said predetermined wavelength λ satisfies λ=4·n·d/N, where N is an even number.

3. An infrared solid-state image pickup device according to claim 2, further comprising:
    a third light receiving element, said third light receiving element being formed on said substrate and including
    a third photoelectric conversion portion formed on said first major surface of said substrate,
    a third infrared transparent insulating layer formed on said third photoelectric conversion portion, and
    a third reflecting layer formed on said third infrared transparent insulating layer,
    a third optical cavity with a third predetermined optical distance being formed between said third photoelectric conversion portion and said third reflecting layer, and
    wherein said third predetermined optical distance is different from said first and second predetermined optical distances by more than 100 nm.

4. An infrared solid-state image pickup device according to claim 2, further comprising:
    a third light receiving element, said third light receiving element being formed on said substrate and including
    a third photoelectric conversion portion formed on said first major surface of said substrate,
    a third infrared transparent insulating layer formed on said third photoelectric conversion portion, and
    a third reflecting layer formed on said third infrared transparent insulating layer,
    a third optical cavity with a third predetermined optical distance being formed between said third photoelectric conversion portion and said third reflecting layer, and
    a fourth light receiving element, said fourth light receiving element being formed on said substrate and including
    a fourth photoelectric conversion portion formed on said first major surface of said substrate,
    a fourth infrared transparent insulating layer formed on said fourth photoelectric conversion portion, and a fourth reflecting layer formed on said fourth infrared transparent insulating layer, a fourth optical cavity with a fourth predetermined optical distance being formed between said fourth photoelectric conversion portion and said fourth reflecting layer, and wherein said third and fourth predetermined optical distances are different from said first and second predetermined optical distances by more than 100 nm, respectively.

5. An infrared solid-state image pickup apparatus comprising:

a device including a substrate which is transparent with respect to infrared light;

a first light receiving element formed on said substrate and including a first photoelectric conversion portion formed on a first major surface of said substrate, a first infrared transparent insulating layer formed on said first photoelectric conversion portion, and a first reflecting layer formed on said first infrared transparent insulating layer, a first optical cavity with a first predetermined optical distance being formed between said first photoelectric conversion portion and said first reflecting layer;

a second light receiving element formed on said substrate and including a second photoelectric conversion portion formed on said first major surface of said substrate, a second infrared transparent insulating layer formed on said second photoelectric conversion portion, and a second reflecting layer formed on said second infrared transparent insulating layer, a second optical cavity with a second predetermined optical distance, which is different from said first predetermined optical distance by more than 100 nm, being formed between said second photoelectric conversion portion and said second reflecting layer;

an optical system to guide light from an object to said first and second light receiving elements; and an arithmetic circuit to read signals generated from said first and second light receiving elements;

wherein said first predetermined optical distance is set such that a valley in sensitivity to light incident to said first optical cavity exists at a predetermined wavelength within a predetermined wavelength range in a sensitivity curve of said first optical cavity, light within said wavelength range being photoelectrically convertible by said second light receiving element, and wherein said first and second photoelectric conversion portions convert light incident from a second major surface of said substrate, which is opposite to said first major surface, and transmitted through said substrate.

6. An infrared solid-state image pickup apparatus according to claim 5, wherein said arithmetic circuit includes deviation detection means for detecting a difference between an electrical signal output from said first light receiving element and that from said second light receiving element.

7. An infrared solid-state image pickup apparatus according to claim 5, further comprising:

a third light receiving element, said third light receiving element being formed on said substrate and including a third photoelectric conversion portion formed on said first major surface of said substrate, a third infrared transparent insulating layer formed on said third photoelectric conversion portion, and a third reflecting layer formed on said third infrared transparent insulating layer, a third optical cavity with a third predetermined optical distance being formed between said third photoelectric conversion portion and said third reflecting layer, said third predetermined optical distance being different from said first and second predetermined optical distances by more than 100 nm, respectively, wherein said arithmetic circuit includes first deviation detection means for detecting a difference between an electrical signal output from said first light receiving element and that from said second light receiving element;

second deviation detection means for detecting a difference between the electrical signal output from said second light receiving element and that from said third light receiving element, and ratio detection means for detecting a ratio between the two differences detected by said first and second deviation detection means.

8. An infrared solid-state image pickup apparatus according to claim 5, further comprising:

a third light receiving element, said third light receiving element being formed on said substrate and including a third photoelectric conversion portion formed on said first major surface of said substrate, a third infrared transparent insulating layer formed on said third photoelectric conversion portion, and a third reflecting layer formed on said third infrared transparent insulating layer, a third optical cavity with a third predetermined optical distance being formed between said third photoelectric conversion portion and said third reflecting layer; and a fourth light receiving element, said fourth light receiving element being formed on said substrate and including a fourth photoelectric conversion portion formed on said first major surface of said substrate, a fourth infrared transparent insulating layer formed on said fourth photoelectric conversion portion, and a fourth reflecting layer formed on said fourth infrared transparent insulating layer, a fourth optical cavity with a fourth predetermined optical distance being formed between said fourth photoelectric conversion portion and said fourth reflecting layer, said third and fourth predetermined optical distances being different from said first and second predetermined optical distances by more than 100 nm, respectively;

wherein said arithmetic circuit includes first deviation detection means for detecting a difference between an electrical signal output from said first light receiving element and that from said second light receiving element;

second deviation detection means for detecting a difference between an electrical signal output from said third light receiving element and that from said second light receiving element, and third deviation detection means for detecting a difference between an electrical signal output from said fourth light receiving element and that from said second light receiving element.

9. An infrared solid-state image pickup apparatus according to claim 5, wherein a difference in optical distance between said first and second light receiving elements is a result of a difference in thicknesses of insulating layers.

10. An infrared solid-state image pickup apparatus according to claim 5, wherein a difference in optical distance between said first and second light receiving elements is a result of a difference in refractive indexes of insulating layers.

11. An infrared solid-state image pickup apparatus according to claim 5, further comprising a filter for filtering light having a predetermined wavelength.

12. An infrared solid-state image pickup device according to claim 1, wherein a difference in optical distance between said first and second light receiving elements is a result of a difference in thicknesses of insulating layers.

13. An infrared solid-state image pickup device according to claim 1, wherein a difference in optical distance between said first and second light receiving elements is a result of a difference in refractive indexes of insulating layers.

* * * * *